United States Patent
Zimmer et al.

(10) Patent No.: US 7,495,434 B2
(45) Date of Patent: Feb. 24, 2009

(54) MAGNETORESISTIVE SENSOR ELEMENT FOR SENSING A MAGNETIC FIELD

(75) Inventors: Juergen Zimmer, Ottobrunn (DE); Ulrich Klostermann, Munich (DE); Christian Alof, Sauerlach (DE)

(73) Assignee: Infineon Technologies AG, Munich (DE)

( * ) Notice: Subject to any disclaimer, the term of this patent is extended or adjusted under 35 U.S.C. 154(b) by 39 days.

(21) Appl. No.: 11/558,525

(22) Filed: Nov. 10, 2006

(65) Prior Publication Data

US 2008/0100289 A1    May 1, 2008

(30) Foreign Application Priority Data

Oct. 27, 2006    (DE) .................. 10 2006 050 833

(51) Int. Cl.
  G01R 33/02    (2006.01)
  G01B 7/14    (2006.01)
(52) U.S. Cl. .................. 324/252; 324/207.12
(58) Field of Classification Search ............ 324/207.21, 324/252, 225, 226, 263, 224, 207.22; 338/32 R; 360/324.2, 324.12, 324.1, 110, 313, 320; 365/173, 129, 171
See application file for complete search history.

(56) References Cited

U.S. PATENT DOCUMENTS

| 5,351,028 | A | 9/1994 | Krahn |
| 6,812,039 | B1 * | 11/2004 | Kohlstedt et al. .............. 438/3 |
| 2005/0151552 | A1 | 7/2005 | Abraham et al. |

FOREIGN PATENT DOCUMENTS

| DE | 19938215 A1 | 2/2001 |
| DE | 10342572 A1 | 7/2004 |
| DE | 69727261 T2 | 10/2004 |

* cited by examiner

*Primary Examiner*—Reena Aurora
(74) *Attorney, Agent, or Firm*—Eschweiler & Associates, LLC

(57) ABSTRACT

A magnetoresistive sensor element has a first magnetic layer structure, a second magnetic layer structure, and a barrier layer. The resistance $R_1$ of the first magnetic layer structure, the resistance $R_2$ of the second magnetic layer structure and resistance-area product RA define a characteristic length $\lambda$ of the magnetoresistive sensor element by a functional relation. The contact spacing $X_0$ has an m-fold value of the characteristic length $\lambda$ with $0.1<m<20$, the first contact terminal a first edge spacing $X_1$ from the edge of the first magnetic layer structure with an n-fold value of the characteristic length $\lambda$ with $0.5<n$, the second contact terminal a second edge spacing $X_2$ from the edge of the first magnetic layer structure with a p-fold value of the characteristic length $\lambda$ with $0.5<p$, the resistance $R_1$ a q-fold value of the resistance $R_2$ with $q>1$.

41 Claims, 12 Drawing Sheets

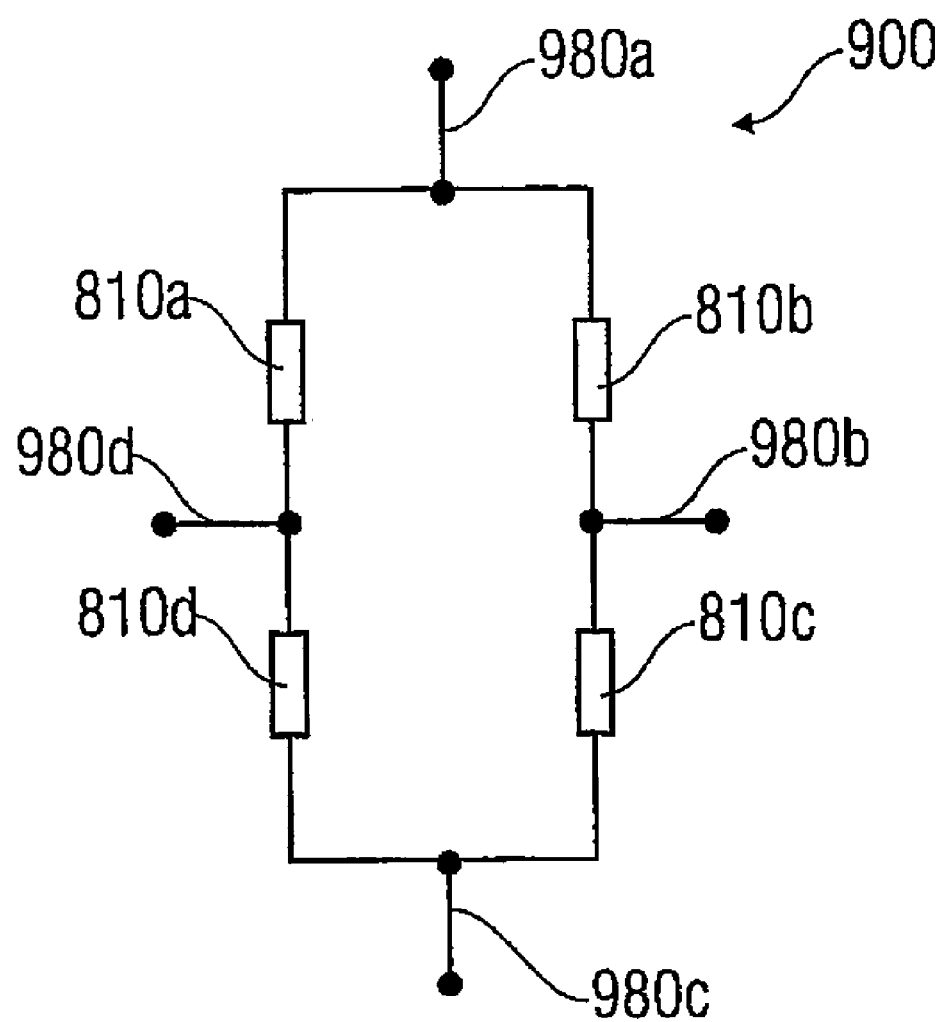

MAGNETORESISTIVE SENSOR ELEMENT FOR SENSING A MAGNETIC FIELD

CROSS-REFERENCE TO RELATED APPLICATIONS

This application claims priority from German Patent Application No. 10 2006 050 833.5, which was filed on Oct. 27, 2006, and is incorporated herein by reference in its entirety.

TECHNICAL FIELD

The present invention relates to a magnetoresistive sensor element and, in particular, to an integrated magnetoresistive sensor utilizing the TMR (tunneling magnetoresistance) effect in a CIP (current in plane) configuration.

BACKGROUND

Sensing small magnetic fields by great magnetoresistance changes, with little chip area consumption and little manufacturing process complexity, is increasing in importance in applications in automobile and industrial electronics. Thus, it is particularly important to achieve compatibility and optimization of parameter swing or signal swing (magnetoresistance change in dependence on a magnetic field change), chip area, manufacturing process complexity, current consumption etc.

Presently, GMR (giant magnetoresistance) structures and TMR structures or TMR layer systems are employed in sensor technology. In electrical contacting, a distinction is made between a CIP configuration and a CPP (current perpendicular to plane) configuration. In the CIP configuration, the layer system is contacted from one side and the current flows parallel to the layer system, whereas in the CPP configuration the layer system is contacted from two sides so that the current flows perpendicular to the layer system. GMR layer systems are typically operated in the CIP configuration, which entails comparatively little process complexity due to contacting being required from only one side to a layer package or layer structure. However, the signal swing, i.e. a resistance change as a consequence of a change in the magnetic field to be sensed and, in particular, a change in the orientation of the magnetic measuring field relative to a reference magnetic field, in GMR layer systems, such as, for example, in so-called spin-valve systems, is presently limited to 10-20%. Greater sensitivity would be desirable for further improvement of characteristics of magnetoresistive sensors and for extending the fields of application. Additionally, a disadvantageous temperature stability of GMR systems is the result of a potential diffusion behavior of materials, such as, for example, copper.

On the other hand, resistance changes of more than 200% are at present measured in TMR structures or layer systems, which are thus more sensitive than GMR structures or GMR layer systems by a factor 20. However, the CPP configuration is used for achieving a maximum effect quantity (signal swing) requiring contacting the layer package or layer system from two sides. Compared to GMR contactings, this entails increased process and cost complexity, since at least one additional metallization level is necessary.

Thus, it would be desirable to find a way of achieving a considerable increase in the signal swing when maintaining the relatively simple and technically controllable CIP contacting, like in a GMR process.

SUMMARY

In accordance with embodiments, a magnetoresistive sensor element for sensing a magnetic field acting on the magnetoresistive sensor element may comprise a first magnetic layer structure with a resistance $R_1$ per unit area and a first and a second main surface, wherein a first and a second contact terminal are arranged on the second main surface at a contact spacing $X_0$, a second magnetic layer structure with a resistance $R_2$ per unit area and a first and a second main surface, a barrier layer arranged between the first and the second magnetic layer structure adjacent to the first main surfaces thereof, so that the magnetoresistive sensor element comprises a resistance-area product RA perpendicular to the layer plane. The values $R_1$, $R_2$ and RA result in or provide a characteristic length $\lambda$ of the magnetoresistive sensor elements by $$\lambda = \sqrt{\frac{RA}{R_1 + R_2}}.$$

The contact spacing $X_0$ comprises an m-fold value of the characteristic length $\lambda$ with $0.1<m<20$, the first contact terminal comprises a first edge spacing $X_1$ from the edge of the first magnetic layer structure with an n-fold value of the characteristic length $\lambda$ with $0.5<n$, the second contact terminal comprises a second edge spacing $X_2$ from the edge of the first magnetic layer structure with a p-fold value of the characteristic length $\lambda$ with $0.5<p$, the resistance $R_1$ comprises a q-fold value of the resistance $R_2$ with $q>1$.

BRIEF DESCRIPTION OF THE DRAWINGS

Preferred embodiments of the present invention will be detailed subsequently referring to the appended drawings, in which:

FIG. 2 is a resistor equivalent circuit diagram of the TMR layer system of FIG. 1a;

FIG. 19 is an illustration of four TMR elements connected to form a Wheatstone full bridge.

Figure 1A:
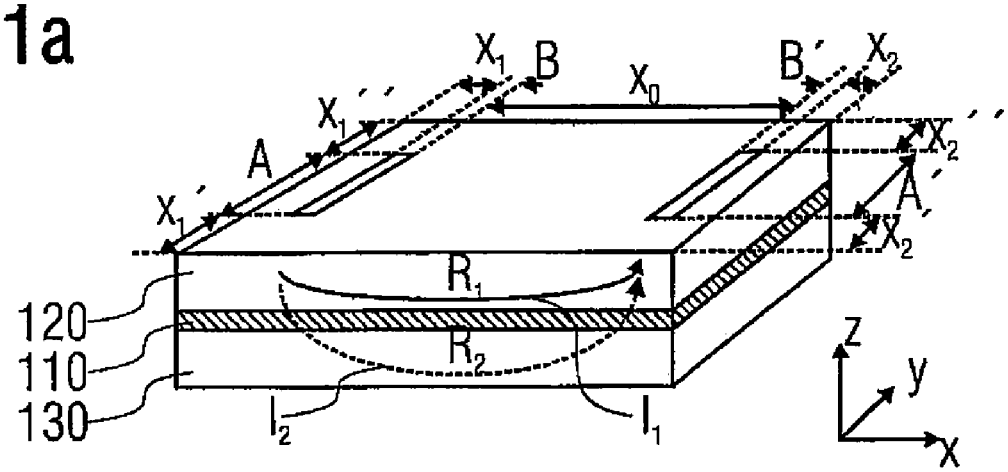
FIG. 1a is a schematic cross sectional view of a TMR layer system having two contact areas according to an embodiment.

Before embodiments will be detailed subsequently referring to the drawings, it is pointed out that elements having the same effect or the same function are provided with the same reference numerals in the drawings so that the descriptions of these elements are exchangeable among the various subsequent embodiments.

DETAILED DESCRIPTION

In one embodiment, the first magnetic layer structure may comprise a first magnetization and the second magnetic layer structure a second magnetization, wherein a change $\Delta$ in the external magnetic field causes a relative change of the first and second magnetizations.

According to further embodiments, a magnetoresistive sensor element for sensing a magnetic field acting on the magnetoresistive sensor element, may comprise a first magnetic layer structure with a resistance $R_1$ per unit area and a first and a second main surface, wherein a first and a second contact terminal are arranged on the second main surface at a contact spacing $X_0$, and wherein the first magnetic layer structure comprises a pinned reference magnetization, a second magnetic layer structure with a resistance $R_2$ per unit area and a first and a second main surface, wherein the second magnetic layer structure comprises a magnetization orienting itself corresponding to an external magnetic field, and a barrier layer arranged between the first and the second magnetic layer structure adjacent to the first main surfaces thereof, so that the magnetoresistive sensor element comprises a resistance-area product RA perpendicular to the layer plane. The values $R_1$, $R_2$ and RA may result in a characteristic length $\lambda$ of the magnetoresistive sensor elements by $$\lambda = \sqrt{\frac{RA}{R_1 + R_2}}.$$

In one embodiment, the contact spacing $X_0$ may comprise an m-fold value of the characteristic length $\lambda$ with 0.1<m<20, the first contact terminal comprises a first edge spacing $X_1$ from the edge of the first magnetic layer structure with an n-fold value of the characteristic length $\lambda$ with 0.5<n, the second contact terminal comprises a second edge spacing $X_2$ from the edge of the first magnetic layer structure with a p-fold value of the characteristic length $\lambda$ with 0.5<p, the resistance $R_1$ comprises a q-fold value of the resistance $R_2$ with q>1.

According to further embodiments, a magnetoresistive sensor element for sensing a magnetic field acting on the magnetoresistive sensor element, may comprise a first magnetic layer structure with a resistance $R_1$ per unit area and a first and a second main surface, wherein a first and a second contact terminal are arranged on the second main surface at a contact spacing $X_0$, and wherein the first magnetic layer structure comprises a free magnetization orienting itself corresponding to an external magnetic field, a second magnetic layer structure with a resistance $R_2$ per unit area and a first and a second main surface, wherein the second magnetic layer structure comprises a pinned reference magnetization, a barrier layer arranged between the first and the second magnetic layer structure adjacent to the first main surfaces thereof, so that the magnetoresistive sensor element comprises a resistance-area product RA perpendicular to the layer plane. In one embodiment, the values $R_1$, $R_2$ and RA may result in a characteristic length $\lambda$ of the magnetoresistive sensor elements by $$\lambda = \sqrt{\frac{RA}{R_1 + R_2}},$$

wherein the contact spacing $X_0$ comprises an m-fold value of the characteristic length $\lambda$ with 0.1<m<20. The first contact terminal comprises a first edge spacing $X_1$ from the edge of the first magnetic layer structure with an n-fold value of the characteristic length $\lambda$ with 0.5<n, the second contact terminal comprises a second edge spacing $X_2$ from the edge of the first magnetic layer structure with a p-fold value of the characteristic length $\lambda$ with 0.5<p, the resistance $R_1$ comprises a q-fold value of the resistance $R_2$ with q>1.

According to embodiments, a method of producing a magnetoresistive sensor element may comprise the steps of producing a first magnetic layer structure with a first and a second main surface and a resistance $R_1$ per unit area, contacting the first magnetic layer structure at the second main surface with a first and a second contact terminal at a contact spacing $X_0$ as well as a first and a second edge spacing $X_1$, $X_2$ from the edge of the first magnetic layer structure, producing a barrier layer with a resistance-area product RA on the first main surface of the first magnetic layer structure, and producing a second magnetic layer structure with a first and a second main surface with a resistance $R_2$ per unit area on the barrier layer. In one embodiment, the values $R_1$, $R_2$ and RA may result in a characteristic length $\lambda$ of the magnetoresistive sensor elements by $$\lambda = \sqrt{\frac{RA}{R_1 + R_2}}.$$

In one embodiment, the contact spacing $X_0$ may comprise an m-fold value of the characteristic length $\lambda$ with $0.1<m<20$, the first edge spacing $X_1$ comprises an n-fold value of the characteristic length $\lambda$ with $0.5<n$, the second edge spacing $X_2$ comprises a p-fold value of the characteristic length $\lambda$ with $0.5<p$, the resistance $R_1$ comprises a q-fold value of the resistance $R_2$ with $q>1$, and the first magnetic layer structure comprises a first magnetization and the second magnetic layer structure a second magnetization, wherein a change $\Delta$ in the external magnetic field causes a relative change of the first and second magnetizations with respect to each other.

Other embodiments may include a use of a magnetoresistive sensor element based on the TMR effect for sensing a magnetic field acting thereon, wherein the magnetoresistive sensor element comprises a first magnetic layer structure with a first and a second main surface, a second magnetic layer structure with a first and a second main surface, and a barrier layer arranged between the first and the second magnetic layer structures adjacent to the first main surfaces thereof, wherein a first and a second contact terminal are arranged on the second main surface of the first magnetic layer structure at a contact spacing $X0$ to each other for impressing an impression signal.

In magnetoresistive sensor elements based on the TMR (tunneling magnetoresistance) effect, charge carriers are able to tunnel between two magnetic layers separated by a dielectric tunnel barrier layer or simply barrier layer with a probability depending on a relative magnetization of the two magnetic layers, which is known as TMR effect. The tunneling probability corresponding to a tunnel or barrier resistance depends on the relative position of the two magnetization directions of the two magnetic layers and will be the greatest or the barrier resistance will be the smallest if the magnetization of the two magnetic layers is parallel. In contrast, the barrier resistance will be the greatest if the magnetization of the two magnetic layers is antiparallel.

If one of the two magnetic layers has a fixed or pinned reference magnetization and the other magnetic layer structure acts as a sensor layer, i.e. has a magnetization orienting itself in correspondence with an external magnetic field, the TMR effect can be utilized to sense a change in the external magnetic field compared to the reference magnetization. This may take place by measuring a resistance between two contact terminals, wherein contacting is preferably performed such that as many charge carriers as possible pass the barrier layer and thus a great signal swing, i.e. a great change in resistance when changing the external magnetic field, is produced. Subsequently, this signal swing will also be referred to as magnetoresistance change or resistance change effect and is generally given by the following equation:

$$MR = \frac{\Delta R}{R}, \quad (1)$$

R being a resistance and $\Delta R$ being a corresponding change in resistance. This relation can be defined specifically for the TMR effect by the following equation:

$$TMR = \frac{R_{ap} - R_p}{R_p} \quad (2)$$

the factors $R_{ap}$ and $R_p$ being the resistances in antiparallel and parallel magnetization, respectively, of the sensor layer compared to the reference magnetization. The abbreviations MR and TMR also simply refer to the magnetoresistance or magnetoresistive effect and are often quoted in percent.

As the subsequent discussion will make clear, the embodiments allow a considerable increase in the signal swing and thus allow improved sensor characteristics while maintaining simple contacting. To achieve the improved sensor characteristics compared to conventional solutions, common implementation and interaction of several aspects or influence variables is done, which will be explained briefly.

(a) One aspect is using TMR stacks. TMR stacks result in extended application possibilities of the sensor compared to the GMR stack by greater a magnetoresistance change, such as, for example, by using smaller magnets or greater spacings between the magnetic and the sensor element.

(b) Another aspect is using a CIP configuration. The contacting of the sensor area from one side, as is the case in the CIP configuration and which may take place from the top or the bottom, allows a simple manufacturing process compared to a two-sided contacting as is used in the CPP configuration. This process corresponds to the procedure in GMR stacks and thus is cost-saving due to synergies with regard to selecting the design and layout and the technology used.

(c) Another aspect is selecting the spacing of the contact terminals or contacts (contact vias) on a main surface of the TMR layer stack relative to one another. The change in magnetoresistance measured depends on the spacing of the contacts which may, for example, be realized by contact vias. With too small a spacing $X_0$ ($X_0 \rightarrow 0$), the entire current will flow through the layer facing the contact and only a very small part will flow through the tunnel resistor. With too great a spacing $X_0$, the current will flow through both magnetic layers and the tunnel resistor looses its influence. An optimum for the magnetoresistance (MR) in CIP contacting is in the order of magnitude of a few characteristic lengths $\lambda$, $\lambda$ resulting from a resistance-area product RA and resistances $R_1$, $R_2$ per unit area of the two magnetic layers and, exemplarily, being between around 1.5 µm and 20 µm.

(d) A fourth aspect relates to optimizing the magnetoresistance by adjusting the resistances of the magnetic layers, i.e. of $R_1$ for a first magnetic layer where the layer stack is contacted (which is also referred to as the top electrode and $R_1$ or $R_T$) and of $R_2$ for a second magnetic layer (which is also referred to as the bottom electrode and $R_2$ or $R_B$). Generally, it is of advantage when $R_1 > R_2$ or, in the most favorable case, when $R_1 >> R_2$. The consequence is that a current portion passing the barrier layer is exposed to smaller a resistance parallel to the layer plane than a current portion not passing the barrier layer. Thus, the tunnel effect at the change in resistance in dependence on the external magnetic field or the orientation thereof gains in importance, i.e. the corresponding signal swing described by the equations (1) and (2) increases.

(e) A fifth aspect for achieving improved sensor characteristics results from the fact that short circuits potentially arising across the barrier (barrier layer) can be controlled better in the etching processes necessary for structuring and typically used with correspondingly selected dimensions and thus have less critical an effect. It is to be pointed out that TMR structures in a CPP configuration have a relatively high resistance due to the barrier layer and thus the sensor characteristics are interfered with severely if short circuits cannot be ruled out effectively, for example across an edge region of the TMR layer structure. Short circuits may, for example, be avoided by the contact terminals having a minimum spacing from the edge or the layers of the TMR layer sequence having different lateral layer widths (for example a stepped layer sequence). How the embodiments according to the present application avoid this problem will be explained in greater detail below.

Utilizing the aspects mentioned or optimization thereof, embodiments are based on the utilization or usage of the CIP configuration in (integrated) magnetoresistive sensors based on TMR technology, the TMR layer system being contacted from one side only in contrast to conventional TMR contacting. Further embodiments also describe a method for manufacturing magnetoresistive sensors of this kind. Thus, it is essential for a great measurement signal (signal swing) that certain ranges are kept to for the spacings and dimensioning of the contact or contact points for impressing the impression signal and for sensing the measurement signal and the specific selection and dimensioning of the layers of the resistances $R_1$, $R_2$, $R_{barr}$ of the TMR layer system. In this context, the term CIPT configuration (i.e. a CIP configuration in a TMR layer system) will be used subsequently to distinguish same from CIP configurations in GMR systems.

Depending, for example, on the number of contacts, there are several procedures with regard to impressing the impression signal and sensing the measurement signal.

Exemplarily, two contacts used both for impressing the impression signal and for sensing the measurement signal could be provided in the magnetoresistive sensor. Thus, a voltage drop across the two contacts between which a predetermined and preferably constant current is impressed or flows can be measured on the one hand. On the other hand, however, it is also possible to apply a predetermined and preferably constant voltage to the contacts to sense or measure the resulting current flow.

In the first case, the voltage drop across the two contacts is sensed and in the second case the current intensity between the two contacts and through the layer resistors is sensed, wherein the TMR effect causes a corresponding change in the voltage drop or the current intensity when the magnetic field to be measured changes.

According to embodiments, however, it is also possible to provide separate contact assemblies or contact pairs for impressing the impression signal and for sensing the measurement signal. The magnetoresistive sensor may thus comprise further contacts or contact pairs so that impressing the impression signal can be performed by a first contact pair and sensing the measurement signal by a second contact pair.

Subsequently, embodiments will be discussed in greater detail referring to FIGS. 1a and 1b. FIG. 1a shows a schematic cross sectional view of a TMR layer system with the (x,y) plane as the base area having a first magnetic layer structure 120, a second magnetic layer structure 130 and a barrier layer 110 arranged between the first magnetic layer structure 120 and the second magnetic layer structure 130. The first magnetic layer structure 120 is contacted by a first contact terminal 140 having a width A and a length B and a second contact terminal 150 having a width A' and a length B' in a contact spacing $X_0$. The contact terminals 140, 150 do not yet imply a structural characteristic, but only mark an area where preferably contacting is made, such as, for example, via contact vias from a substrate or a metallization layer level. Subsequently, these will also be referred to as contact areas 140, 150. In further embodiments, the contact areas 140, 150 may be provided with a metallization in the form of contact pads in order to keep contact resistances, for example, as small as possible.

Figure 1B:
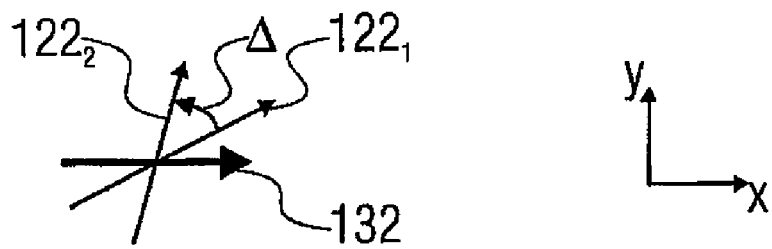
FIG. 1b is a schematic illustration of a change in a sensor magnetization compared to a reference magnetization.

FIG. 1b shows an exemplary pinned magnetization 132 of a reference layer in the (x,y) plane of the drawing which may either be formed by the first magnetic layer structure 120 or by the second magnetic layer structure 130. The layer not acting as reference layer is implemented as a sensor layer so that the magnetization thereof orients itself corresponding to the magnetization of an external magnetic field 122. If the external magnetic field 122 or the component resulting in the (x,y) plane of drawing changes, such as, for example, by a value $\Delta$, i.e. from the direction $122_1$ to a direction $122_2$, the magnetization of the sensor layer will follow this change $\Delta$ and have the direction $122_2$.

FIG. 1a in particular serves improved understanding of the relevant parameters and is to explain the principle of a CIPT configuration on which the further embodiments are based. To simplify the description of the concept of the present application, a complex multi-layered layer system is reduced in FIG. 1a to three main layers, the first magnetic layer structure 120 also being referred to as top electrode and the second magnetic layer structure 130 also being referred to as bottom electrode.

The first magnetic layer structure 120 generally includes a layer package or layer stack on the one side of the barrier layer 110, i.e. on the side of the contact areas (=contact terminals) 140 and 150, and is contacted in the regions of the first and second contact areas 140 and 150 which are in a contact spacing $X_0$. The second magnetic layer structure 130 includes a layer package on the other side of the barrier layer 110 and is on the side facing away from the contact areas 140 and 150. It is preferable for the contact areas or contact terminals 140 and 150 to have a minimum spacing, i.e. a minimum spacing to be kept to, to the edge of the layer structure so that short circuits at the edge are no longer electrically relevant. The edge spacings of the first contact terminal 140 are referred to by $X_1$, $X'_1$, $X''_1$ and the edge spacings of the second contact terminal 150 are referred to by $X_2$, $X'_2$, $X''_2$. To make the description easier, generally the minimum edge spacing $X_1$, $X_2$ is assumed. This will be explained in greater detail below.

In further embodiments, the first and second contact terminals 140, 150 comprise several separate contact regions or there are further contact terminals. The separate contact regions of the first contact terminal 140 may thus have different spacings to the separate contact regions of the second contact terminal 150. This results in the current path to be divided into several separate parallel current paths. This is of advantage to increase measuring precision, which will be explained in greater detail below. It is also possible to select the contact areas 140, 150 not to have a rectangular shape (as is shown in FIG. 1a), but give the contact areas 140, 150 a different shape. Exemplarily, the contact areas 140, 150 may have a round, oval, squared, stripe or irregular shape. In this case, the current transport is made up of several electrically parallel current paths. An effective resulting contact spacing $X_0$ may then, on average, be associated to these current paths, wherein this effective resulting contact spacing matches the contact spacing $X_0$ in the embodiments.

The above assumption with regard to the resulting contact spacing $X_0$ may equally be applied to an implementation of the contact terminals 140, 150 into several separate but preferably electrically parallel contact regions, i.e. several separate contact regions form one contact terminal for impressing the impression signal or for sensing the measurement signal. The contact terminals may also exemplarily have different areas.

The first magnetic layer structure 120 has a resistance $R_1$ per unit area, the barrier layer 110 has a barrier resistance $R_{12}$ and the second magnetic layer structure 130 has a resistance $R_2$ per unit area. The resistances $R_1$, $R_{12}$ and $R_2$ of the three layers are respective mean electrical layer resistances and determine how a current $I_0$ or a current path between the first contact area 140 and the second contact area 150 divides into a current $I_1$ along the first magnetic layer structure 120 and a current $I_2$ along the second layer structure 130.

Here, the resistances depend on the TMR effect of the TMR layer system or contact spacing $X_0$ of the contact vias (i.e. of the first and second contact areas 140, 150). This dependence may be represented as follows:

$$R_1 \propto R_1^0 \times X_0, \tag{3}$$

$$R_2 \propto R_2^0 \times X_0, \tag{4}$$

$$R_{12} \propto R_{12}^{min} \times \frac{(1 + TMR)}{X_0}, \tag{5}$$

i.e. $R_1$ and $R_2$ increase with the contact spacing $X_0$, whereas $R_{12}$ decreases with the contact spacing $X_0$.

Figure 1C:
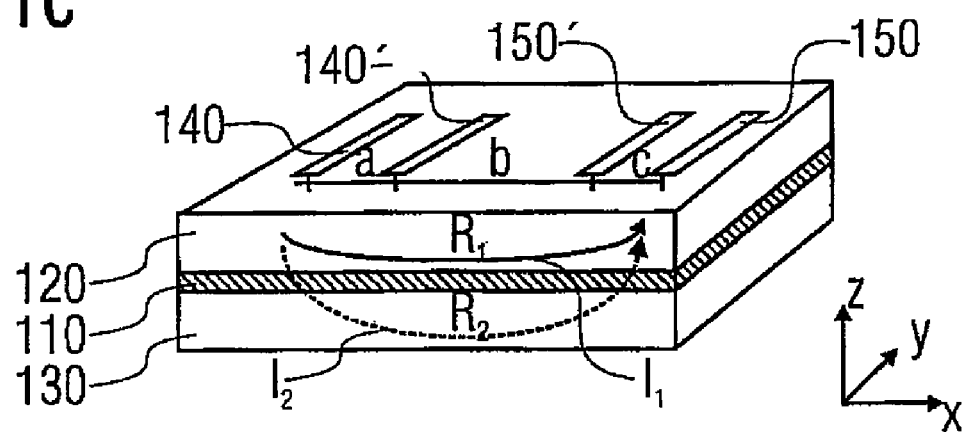
FIG. 1c is a schematic cross sectional view of a TMR layer system having two contact area pairs according to an embodiment.

FIG. 1c shows an embodiment which in addition to the first contact area 140 has a third contact area 140' and in addition to the second contact area 150 has a fourth contact area 150'. Thus, it is possible to preferably use the first and second contact areas 140, 150 for, for example, impressing a current and to use the third and fourth contact areas 140', 150' as measuring contacts to measure, for example, a voltage drop with little power (in the ideal case with no power at all). This is how the force-sense configuration mentioned below is realized. The first and third contact areas 140 and 140' here have a spacing a, the second and fourth contact areas 150 and 150' have a spacing c and the third and fourth contact areas 140', 150' have a spacing b. Preferably, for reasons of symmetry, the spacing a equals the spacing c and the spacing b is as great as possible, but smaller than $X_0$.

Figure 2:
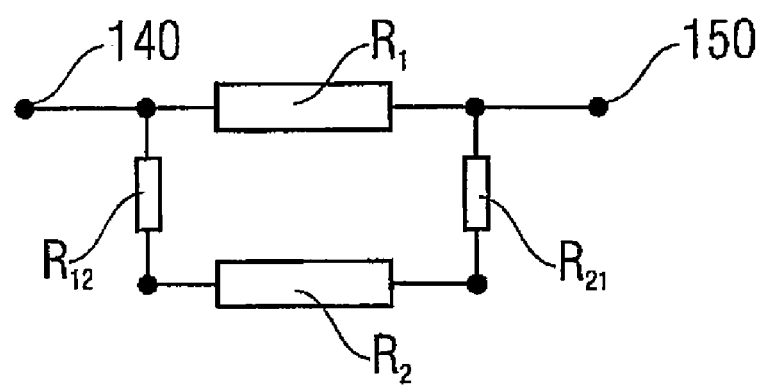

FIG. 2 shows an equivalent electric circuit diagram for the configuration of FIG. 1a using the resistors $R_1$, $R_{12}$ and $R_2$. The first contact terminal 140 and the second contact terminal 150 in this equivalent circuit diagram are represented as electrical contacts separated by a resistor $R_1$. The resistor $R_1$ is bridged by barrier resistors $R_{12}$ and $R_{21}$ connected in series and a resistor $R_2$. The barrier resistors $R_{12}$ and $R_{21}$ will generally have the same values and correspond to $R_{12}$ mentioned above.

The resistance $R_1$ is the resistance which the current $I_1$ flowing through the first magnetic layer structure 120 is exposed to. On the other hand, the current $I_2$ flows through the barrier resistors $R_{12}$ and $R_{21}$ and the bottom resistor $R_2$. The barrier resistors $R_{12}$ and $R_{21}$ are tunnel resistors which electrons overcome when passing from the first magnetic layer structure 120 to second magnetic layer structure 130 and the resistance $R_2$ is the resistance which the electrical current $I_2$ is exposed to along the second magnetic layer structure 130. The barrier resistors $R_{12}$ and $R_{21}$ are largely dependent on the relative magnetization of the first magnetic layer structure 120 compared to the second magnetic layer structure 130 and will be the smallest if the two magnetic fields are in parallel orientation. The tunnel resistances increase with an increasing angle between the two magnetization directions and reach a maximum when oriented antiparallel to each other so that the angle between the two magnetizations corresponds to 180°. If the angle between the two magnetizations is more than 180°, the barrier resistance $R_{12}$, $R_{21}$ will decrease until it has reached a minimum when the two magnetizations are again in parallel orientation, i.e. the angle is 360°.

In this and following embodiments, the number and shape of the contact terminal 140, 150 may be varied. The shape here may be any shape as long as the (resulting effective) spacing $X_0$ mentioned above can be associated or established. In addition, the shape of the magnetoresistive sensor may also be varied and need not have the rectangular surface shown in FIGS. 1a or 1c. Exemplarily, the sensor can have a round, oval or squared design.

Figure 3:
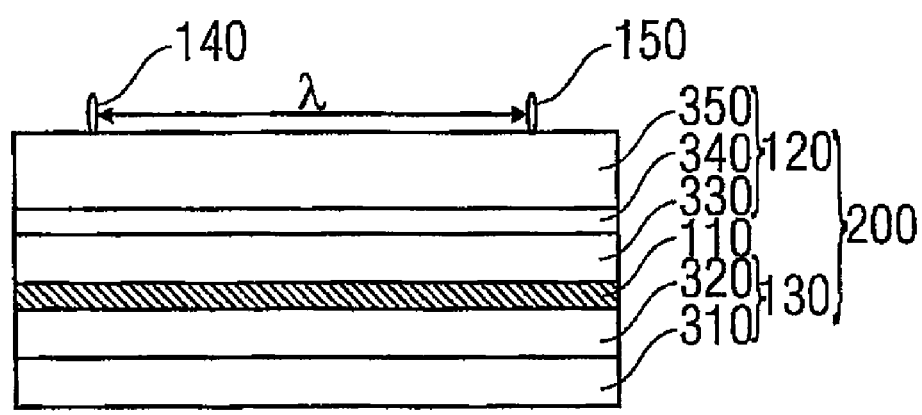
FIG. 3 is a cross sectional view of a layer sequence of an MTJ stack having a characteristic length $\lambda$ as is, for example, exemplarily shown in FIG. 1.

FIG. 3 shows a schematic cross sectional view of an exemplary layer sequence (or layer package) which is also referred to as MTJ (magneto tunnel junction) stack. Like in the embodiment of FIG. 1, a barrier layer 110 separates a first magnetic layer structure 120 from a second magnetic layer structure 130. Both the first magnetic layer structure 120 and the second magnetic layer structure 130 in the present embodiment comprise further layers and form a layer sequence which subsequently will also be referred to as first magnetic layer structure 120 and second magnetic layer structure 130, respectively. The second magnetic layer structure 130 here exemplarily has a seed layer 310 as a first layer on which a reference layer 320 is deposited. What follows is the barrier layer 110 onto which the first magnetic layer structure 120 is deposited, wherein at first a sensor layer 330 is deposited, followed by a cover layer 340 and a mask layer 350. Thus, the first magnetic layer structure 120 includes the sensor layer 330, the cover layer 340 and the mask layer 350.

The individual layers may comprise the following materials (or alternatives) and layer thicknesses. For the seed layer 310: CuN 50 nm (Cu, Ru, Ta, TaN, NiFe, NiFeCr); for the reference layer 320: PtMn 12 nm (NiFeCr/PtMn; IrMn) and additionally a layer sequence CoFe/Ru/CoFe of 2/0.8/2 nm; for the barrier layer 110: MgO 0.6 nm; for the sensor layer 330: NiFe 5 nm (CoFeB, CoFe, CoFeNi); for the cover layer 340: TaN 10 nm (Ta, Ru, Ti, TiN, Cu, CuN); and for the mask layer 350: Ru 7 nm (Ta, TaN, Ti, TiN, Cu, CuN).

To obtain a TMR resistance change, at least a part of the current flowing from the first contact area 140 to the second contact area 150 has to overcome, as has been mentioned above, the tunnel barrier 110 twice. This means that the current only migrating within the first magnetic layer structure 120 to the counter electrode, i.e. the current $I_1$, does not contribute to the signal. The path of the current overcoming the tunnel barrier 110 (i.e. the current $I_2$), may exhibit a change in resistance in the region of tunneling the tunnel barrier 110 with a change Δ of the external magnetic field 122. If the contact spacing $X_0$ of the contact regions is too small, a main part of the current will exclusively cross the first magnetic layer structure 120, i.e. result in a small signal. If the contact spacing $X_0$ is too great, the portion of the change in resistance (limited to an area where charge carriers are tunneling) of the overall resistance is microscopic, which again results in a small signal. The consequence is that there is an optimum contact spacing $X_0$ where the ratio of the change in resistance to the overall resistance (=TMR signal) becomes maximal. The contact spacing $X_0$ is in a order of magnitude of a few characteristic lengths λ which is a function of the layer resistances $R_1$ and $R_2$ and the barrier resistance $R_{12}$ or resistance-area product RA (see equation (6)).

Depending on the materials used and the resistances and/or area resistances thereof, a characteristic length λ can approximately be indicated by:

$$\lambda = \sqrt{\frac{RA}{R_1 + R_2}}, \quad (6)$$

RA being a resistance-area product, which is a characteristic quantity for the materials selected and the (lateral and vertical) sizes and dimensioning of the layer structures or the resulting layer stack.

FIG. 4 shows resistance change effects referenced to the layer TMR effect as a function of the contact area spacing $X_0$.

Figure 4A:
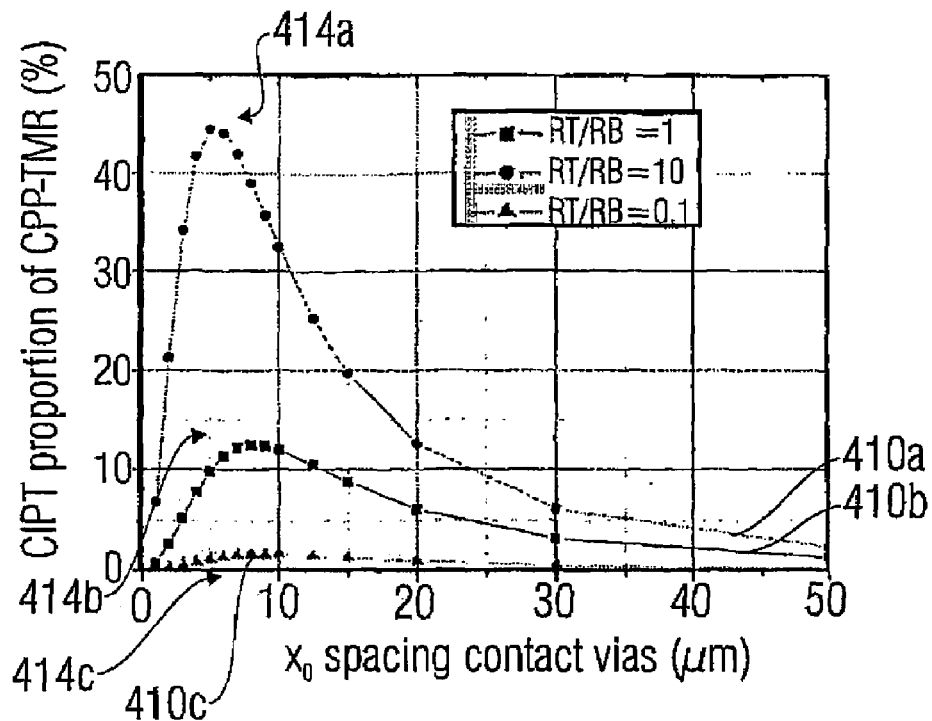
FIG. 4a shows graphs of a resistance change effect referenced to the layer TMR effect as a function of a contact area spacing for different resistance ratios of a top and a bottom electrode layer.

FIG. 4a here shows the resistance change effect referenced to the maximum possible TMR swing of the layer system as a function of a contact area spacing for different ratios $R_1/R_2$, i.e. of the resistances of the first and second magnetic layers 120, 130. Three graphs are shown, a graph 410a showing the resistance change effect if the ratio of the resistances of the first and second magnetic layers 120, 130 equals 10 ($R_1=10R_2$), a graph 410b shows the case if the ratio of the two resistances is equal ($R_1=R_2$), and a graph 410c shows the case if the resistance ratio is 0.1 ($R_2=10R_1$). The graph 410a shows the greatest resistance change effect and the graph 410c shows the smallest resistance change effect.

This effect is made use of in that the ratio $R_1/R_2=q>1$ is to be selected to be as great as possible or the resistance of the second magnetic layer structure 130 should be considerably smaller than the resistance of the first magnetic layer structure 120. The resistances may, for example, be influenced by depositing another well-conducting layer, resulting in a decrease in the resistance, or a changed geometry may result in an increase in resistance. The latter is, for example, possible when the layer has either a smaller width or depth along the current (for example by introducing trenches). The resistances of $R_1$ and $R_2$ are, for example, in a range from 0.5 to 500 ohm per unit area and preferably in a range from 1 to 50 ohm per unit area.

In addition, the graphs 410a, 410b and 410c show that with a decreasing resistance ratio a resistance change effect maximum is shifted towards greater spacings $X_0$ of the contact vias or contact areas.

Using, for example, values of $R_1=R_2=30$ ohm/square (for the case $R_1/R_2=R_T/R_B=1$), $R_{12} A_0=500$ ohm·µm² (with $A_0$=unit area, such as, for example, 1 µm²), the calculation may be performed based on simple analytical models which is based on applying Kirchhoff's rules and assuming an idealized geometry relative to the terminal contacts 140, 150 and the TMR layer structure. The resistance change effect as a function of the spacing $X_0$ can be estimated using equations (3) to (5). It can be recognized from these graphs that a signal quantity significantly depends on the ratio of the layer resistances of the two main layers (i.e. of the first and second magnetic layer structures 120, 130). In these examinations, idealized point-shaped terminal contacts 140, 150 were assumed to point out the dependence of the TMR effect on the (effective) spacing $X_0$ in the best way possible. Spacings $X_0$ which are too small or too great result in a small signal, there is an optimum contact spacing $X_0$ for a maximum effect. Regions for preferred spacings $X_0$ around this optimum contact spacing $X_0$ may also be given as length regions or with regard to the characteristic length $\lambda$ (see below). The optimum contact spacing $X_0$ for a maximum signal, i.e. the points 414a, 414b and 414c, will, as has been mentioned, be shifted slightly towards increased spacings with an increasing resistance $R_1$. The contact spacing may also be expressed using the characteristic length $\lambda$, wherein the contact spacing $X_0$ has an m-fold value of the characteristic length $\lambda$ and the region around the optimum contact spacing $X_0$ is exemplarily given by 0.1<m<20 and, preferably, by 1<m<10. Exemplary spacing regions for the contact spacing $X_0$ are in a range from 0.05 µm to 100 µm and preferably in a range from 0.1 µm to 30 µm, wherein ranges from 1.5 µm to 20 µm and 2 µm to 10 µm are particularly preferred.

Figure 4B:
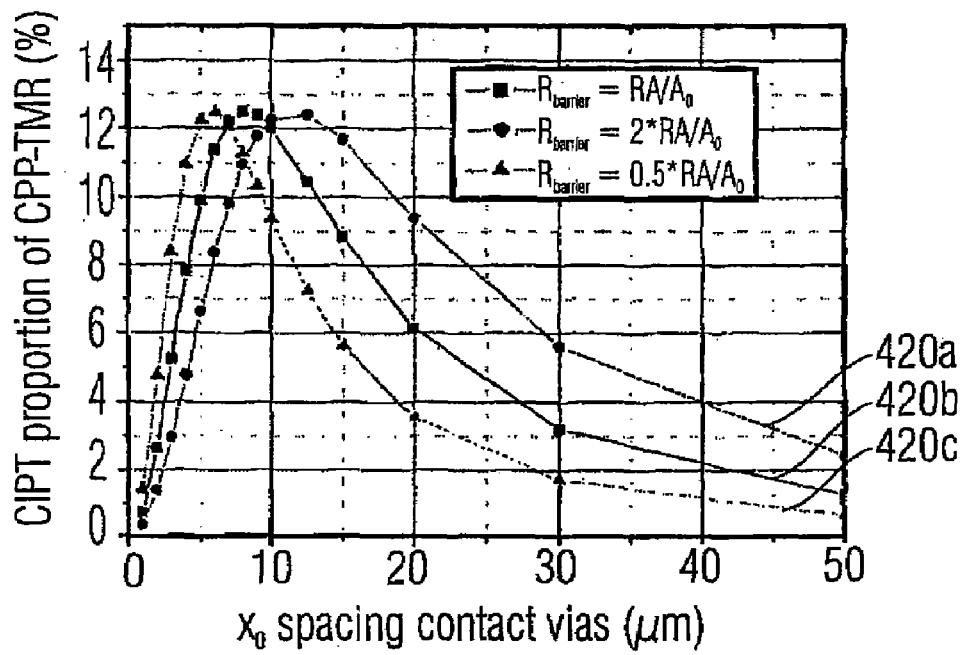
FIG. 4b shows graphs of the resistance change effect referenced to the layer TMR effect as a function of the contact area spacing for different barrier resistances.

FIG. 4b shows three graphs of the resistance change effect referenced to the layer TMR effect for different basic resistances of the tunnel barrier as a function of the contact area spacing $X_0$. In the three graphs, not the ratio $R_1/R_2$ was varied, but the ratio of the barrier resistance $R_{12}$ to the area resistance. The graphs illustrate that a variation of the basic tunnel resistance $R_{barr}$ basically has no influence on the signal quantity, but causes a shift in the optimum spacing $X_0$ of the contact terminals 140 and 150. Thus, graphs 420a shows the case if the barrier resistance $R_{barr}=R_{12}=2$ RA/$A_0$, graph 420b shows the case if the barrier resistance $R_{12}=RA/A_0$, and graph 420c shows the case if the barrier resistance $R_{12}=0.5$ RA/$A_0$. The resistance-area product RA thus is a product of the resistance (depending on the material) and the active area A and is indicated in ohm times area (such as, for example, $\Omega$µm²). In order to relate, as is illustrated in FIG. 4b, the barrier resistance $R_{barr}$ to the resistance-area product RA, the resistance-area product RA is referenced to a unit area $A_0$ (such as, for example, 1 µm²).

Key parameters which are matched to one another for employing TMR sensors in CIPT configurations or which may be used for optimization, thus are the contact spacing $X_0$ of the contact areas 140 and 150, the layer resistances $R_1$ and $R_2$ of the metal layers above and below the tunnel barrier layer 110 and, due to a voltage dependence of the tunnel resistance, the voltage difference between the contacts 140, 150.

Typically, TMR layer systems are implemented as so-called spin-valve structures, wherein a distinction is made between a so-called "top spin valve" (TSV) and "bottom spin valve" (BSV).

Figure 5:
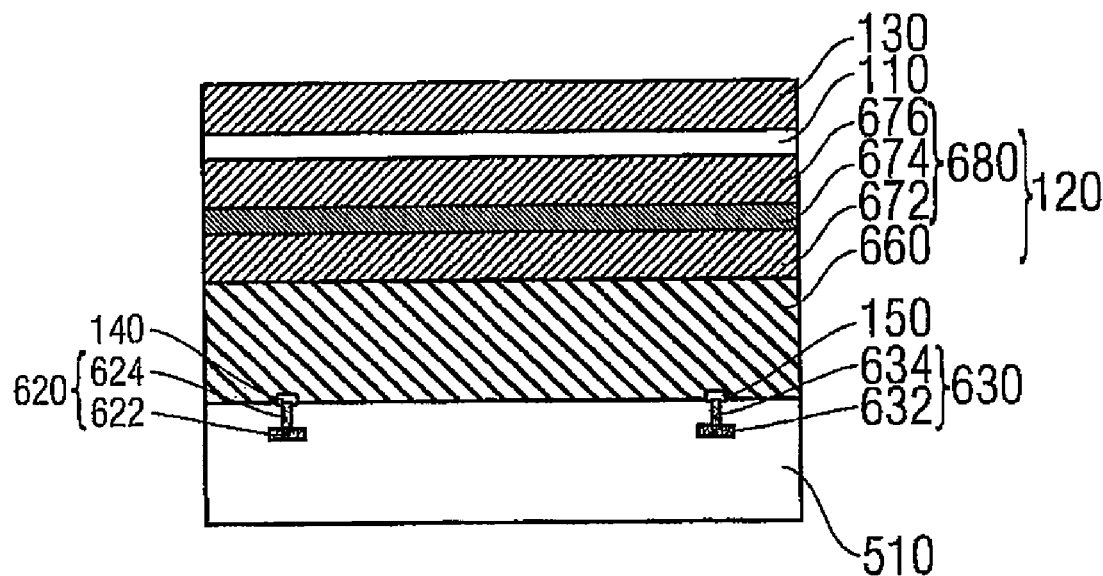
FIG. 5 is a schematic cross sectional view of a "bottom spin valve" TMR layer system in CIP configuration according to an embodiment.

FIG. 5 shows a schematic cross sectional view of a TMR layer system having a BSV setup which is contacted in a CIP configuration. The TMR layer system in this embodiment is deposited on a substrate 510. The substrate 510 has a first contacting 620 having a first contact layer 622 and a first contact bridge 624, and a second contacting 630 having a second contact layer 632 and a second contact bridge 634. The first magnetic layer structure 120 is deposited on the substrate 510, followed by the barrier layer 110 and, finally, the second magnetic layer structure 130 is applied. The first magnetic layer structure 120 in this embodiment includes a layer sequence comprising a natural antiferromagnetic layer structure 660 and an artificial antiferromagnetic layer structure 680, wherein the natural antiferromagnetic layer structure 660 has the first contact terminal 140 and the second contact terminal 150 and is applied onto the substrate 510 such that the first contact terminal 140 is in electrical contact to the first contacting 620 and the second contact terminal 150 is in electrical contact to the second contacting 630. The artificial antiferromagnetic layer structure 680 has a layer sequence including a first sublayer 672, a second sublayer 674 and a third sublayer 676.

Exemplary materials and layer thicknesses may be selected as follows. The natural antiferromagnetic layer structure 660 may, for example, comprise platinum-manganese (PtMn) and an exemplary layer thickness may be in a range of 10 to 50 nm or better between 15 and 30 and preferably around 25 nm. The first and third sublayers 672, 676 may, for example, comprise cobalt-iron (CoFe) in a layer thickness in a range from 1 to 5 nm or better 2 to 3 nm and preferably around 2 nm, and the second sublayer 674 may, for example, comprise Ruthenium (Ru) in a layer thickness in a range from 0.5 to 3 nm and preferably of around 1 nm. Possible materials for the barrier layer 110 are aluminum oxide ($Al_2O_3$) or even magnesium oxide (MgO) in a layer thickness of 0.5 to 2 nm and preferably around 1 nm. Finally, the first magnetic layer structure 120 may, for example, comprise CoFe in a layer thickness from 1 to 5 nm and preferably around 3 nm.

The natural antiferromagnet (NAF) 660 represents the first grown functional layer. The artificial antiferromagnet (AAF) 680 deposited on the natural antiferromagnet 660 having an exemplary layer sequence of CoFe—Ru—CoFe serves to provide a magnetic reference system stable relative to external fields and to reduce the magneto static interaction between the sensor and reference layers. The tunnel barrier 110 which may, as has been mentioned, comprise $Al_2O_3$ or MgO, is deposited thereon and then the actual sensor layer follows, wherein in this embodiment the second magnetic layer structure 130 represents the sensor layer and the first magnetic layer structure 120 represents the reference layer. Contacting in this layer stack would be performed starting from the natural antiferromagnet 660.

Figure 6:
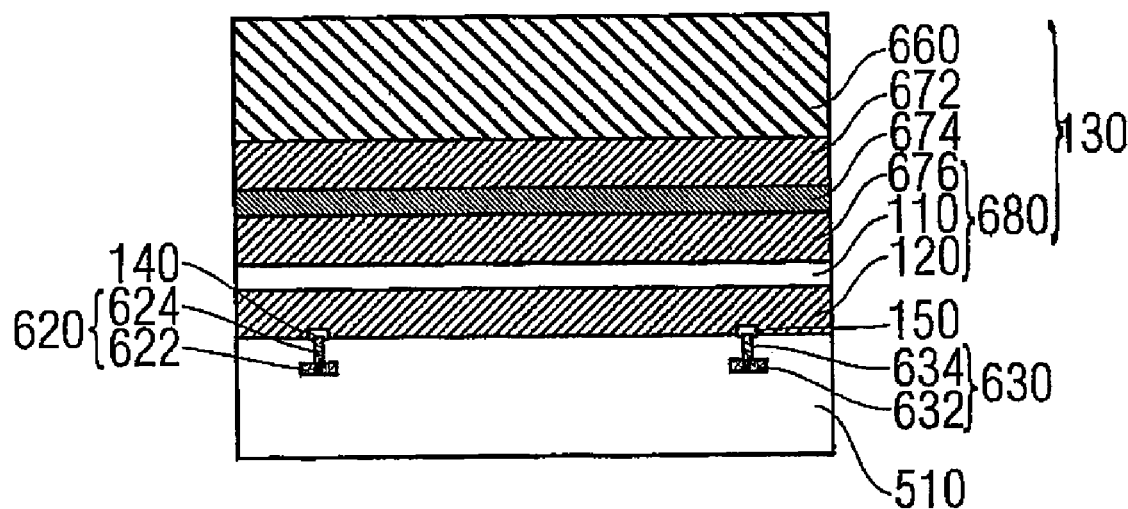
FIG. 6 is a schematic cross sectional view of a "top spin valve" TMR layer system in CIP configuration according to an embodiment.

FIG. 6 shows an embodiment of a TMR layer system having a TSV setup in a CIP configuration. Compared to the embodiment of FIG. 5, this embodiment is different in that the order of the layer deposition is reversed, i.e. the second magnetic layer structure 140 forms the reference layer and the first magnetic layer structure 120 forms the sensor layer. First, the first magnetic layer structure 120 is deposited on the substrate 510 having the first contacting 620 and the second contacting 630, followed by the barrier layer 110, the artificial antiferromagnetic layer structure 680 and, finally, the natural antiferromagnetic layer structure 660. The contacting in this embodiment thus is via the sensor layer which also comprises the first contact terminal 140 as the second contact terminal 150 and is applied onto the substrate 510 such that the first contact terminal 140 gets electrical contact to the first contacting 620 and the second contact terminal 150 gets electrical contact to the second contacting 630. In this embodiment, too, the artificial antiferromagnetic layer structure 680 includes a layer sequence having a first sublayer 672, the second sublayer 674 and the third sublayer 676. Possible materials and possible layer thicknesses here correspond to the data indicated for FIG. 5. Thus, in this embodiment, the natural antiferromagnet 660 is applied as the last layer and this so-called TSV structure would then be contacted according to the embodiments starting from the sensor layer side.

As has already been discussed above, the CIPT effect quantity depends essentially on the layer resistances on this side and the other side of the tunnel barrier 110 relative to the contacting. Due to the different resistivities and layer thicknesses of the natural antiferromagnet 660 and the layer thickness of the artificial antiferromagnet 680 and the sensor layer (i.e. of the second magnetic layer structure 130 in FIG. 5 and the first magnetic layer structure 120 in FIG. 6), the TSV and BSV stacks exhibit different CIPT effect quantities. It is also to be pointed out here that the embodiments described are also conceivable as having a contacting from the top, i.e. on the side facing away from the substrate 510 (see subsequent embodiment). Furthermore, it is possible to realize a four-point measuring process for a highly precise resistance determination (force-sense) with more than two contacts, such as, for example, with four contact regions. Here, two contacts are used for impressing (force) and two contacts are used for sensing (sense) the measurement or sensor signal. This is of advantage since contact junction resistances and lead resistance can be reduced or eliminated very efficiently. This so-called force-sense configuration has already been explained in connection with FIG. 1c.

Figure 7:
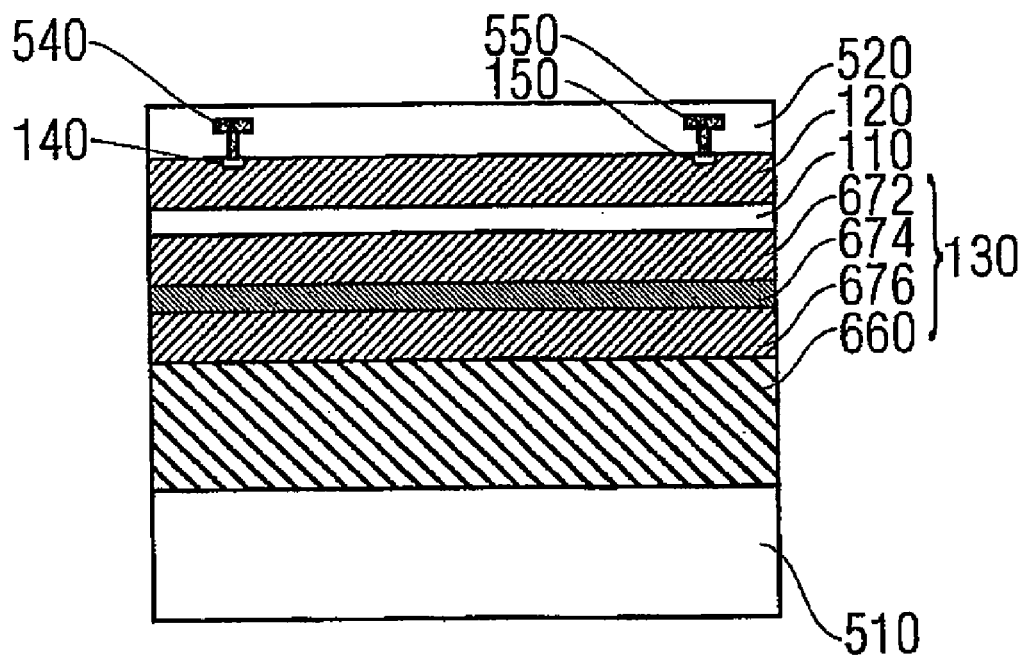
FIG. 7 is a schematic cross sectional view of a "top spin valve" TMR layer system having a contacting on a passivation side in CIP configuration according to an embodiment.

FIG. 7 shows an embodiment differing from that of FIG. 5 in that contacting is not made from the side of the substrate 510, but from the opposite side (i.e. from the top in FIG. 7). The second magnetic layer structure 130 is thus deposited on the substrate 510, subsequently the barrier structure 110 is applied, followed by the first magnetic layer structure 120. In this embodiment, a passivation layer 520 is deposited as a last layer of the TMR layer sequence. The contacting is made from the side of the passivation layer 520 via a first via 540 and a second via 560 making electrical contact to the first contact terminal 140 and to the second contact terminal 150. The contacting selected in this way thus corresponds to the TSV structure where contacting is made from the side of the sensor layer.

Figure 8:
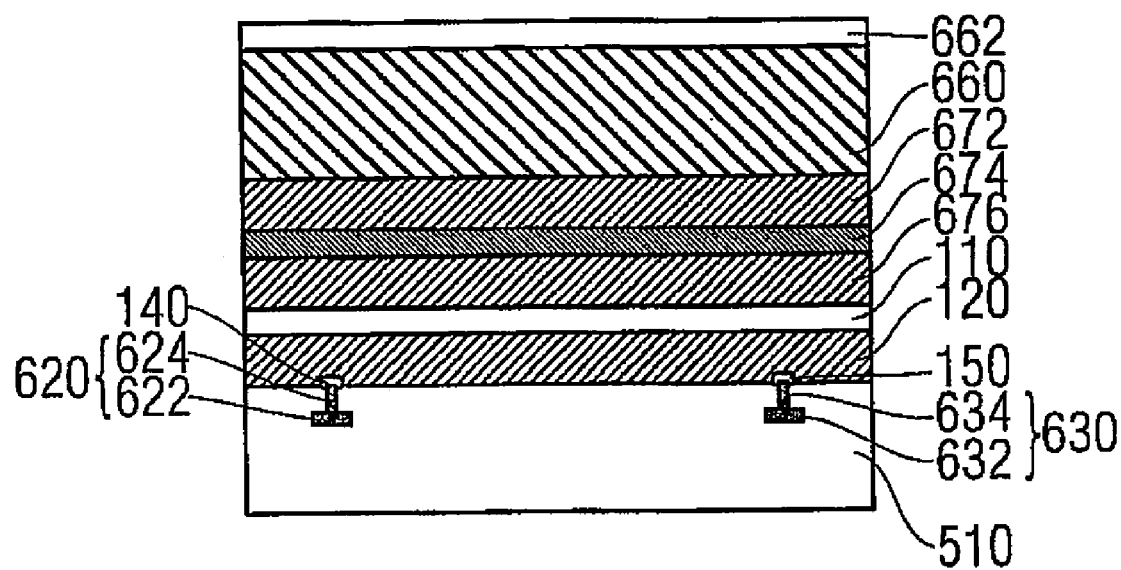
FIG. 8 is a schematic cross sectional view of a "top spin valve" TMR layer system having another conductive layer in CIP configuration according to an embodiment.

FIG. 8 shows another embodiment of a TSV structure (=contacting from the sensor side) where, in addition to the structures shown in FIG. 6, another electrically conductive layer 662 is deposited. At first, the first magnetic layer sue 120 is again deposited on the substrate 510, followed by the barrier layer 110 and finally the artificial antiferromagnetic layer structure 680 and the natural antiferromagnetic layer structure 660 are applied. In this embodiment, the conductive layer 662 is applied to the natural antiferromagnetic layer structure 660, which is of advantage in that the electrical resistance of the reference layer (i.e. in this embodiment of the second magnetic layer structure 130) can be reduced considerable. The effect of a decrease in the resistance $R_2$ resulting in an increase in the resistance change effect can already be seen from FIG. 4a. This effect will be explained in greater detail below.

In further embodiments, a BSV structure (=contacting from the side of the reference layer), as is exemplarily shown in FIG. 5, has an additional well-conductive layer which is applied as a last layer on the sensor layer, i.e. in FIG. 5 on the second magnetic layer structure 130. Here, too, the additional well-conductive layer is responsible for decreasing the resistance $R_2$ of the second magnetic layer structure 130.

In both the TSV structure and the BSV structure, the conductive layer 662 is such that it conducts an electrical current very well but does not influence the magnetic characteristics of the layer structure. Also, it is not necessary to deposit the conductive layer 662 as the last layer, and as long as the magnetic characteristics are not influenced negatively, it can also be implemented as an intermediate layer of the second magnetic layer structure 130.

Alternatively, the resistance $R_1$ of the first magnetic layer structure 120 could be increased in order for the ratio $R_1/R_2$ to be as high as possible. This may, for example, take place by changing the geometry of the first magnetic layer structure 120, which may, for example, be performed by introducing trenches or decreasing the layer width perpendicular to the current propagation.

In further embodiments, contacting may also be made not only via the contact bridges 624, 634 from the substrate 510 or via the vias 540, 550 from the passivation 520, but also via a plurality of contact vias. The third and fourth terminal regions 140', 150' are, for example, provided for this. As has already been illustrated in connection with FIG. 1c, the third and fourth terminal regions 140', 150' may also be used as another contact terminal pair for impressing the impression signal or for sensing the measurement signal. However, several further contact terminal pairs may of course also be used for impressing and/or sensing.

Figure 9:
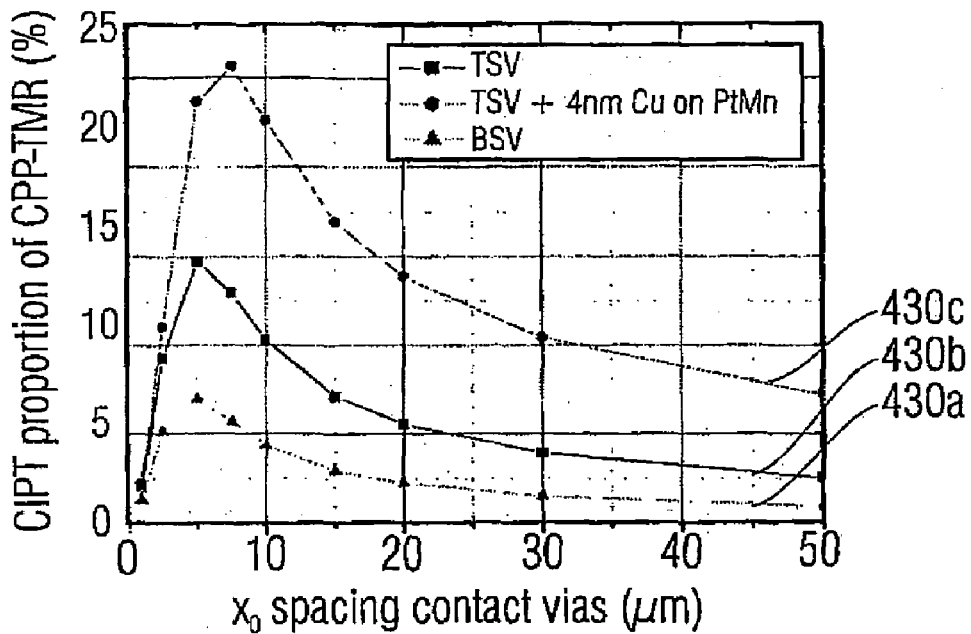
FIG. 9 shows graphs of the resistance change effect as a function of the contact area spacing for contactings of different TMR layer stack types.

FIG. 9 shows the resistance change effect with reference to the layer TMR effect as a function of the contact area spacing $X_0$ for the contacting of various TMR layer stacks. The resistance change effect is the CIPT percentage of the CIP-TMR signal and, hence, refers to the percentage of the overall current passing the barrier layer 110. Three graphs are shown, the graph 430a indicating the resistance change effect for a BSV configuration, and the graph 430b for a TSV configuration depending on the spacing of the contact vias $X_0$. By comparison therewith, the graph 430c shows the resistance change effect for a TSV configuration, where the natural antiferromagnetic layer structure 660 comprises an additional conductive layer 662 of copper, for example, at a layer thickness of about 4 nanometers. All three graphs show a maximum resistance change effect for a certain (optimum) contact spacing $X_0$ and decrease monotonously for a growing contact area spacing $X_0$. The maximum resistance change effect has, however, a different height for the different graphs. Since the additional conductive layer 662 significantly reduces the resistance $R_2$, the resistance change effect for this case is increased significantly.

Thus, FIG. 9 shows the CIPT effect quantity with reference to the TMR effect of the layer system as a function of the contact area spacing $X_0$, as they result from 2D simulations with experimentally determined specific layer resistances, for example. The 2D simulation is based on a theoretical model for a current flow in the TMR layer system in which the geometry perpendicular to the drawing plane (third dimension) is assumed to be infinite, so that a unit length in this dimension can be used for simulation. In comparison with the stack part, which consists of natural and artificial antiferromagnets 660, 680 on the one side of the barrier layer 110, the sensor layer on the other side of the tunnel barrier 110 has higher layer resistivity. For this reason, due to the above-illustrated background, the CIPT effect (maximum resistance change effect) for the TSV structure (graph 430b) at ~15% is about twice as high as for the BSV configuration (graph 430a), which is why the TSV stack proves advantageous here. The CIPT effect for the TSV structure may still be increased significantly if the layer resistance of the layer package lying above the tunnel barrier 110 is reduced. As shown in FIG. 8, for example, this may be done by a further very well conducting layer 662 on the natural antiferromagnet 660 (e.g. PtMn), for example with Cu.

In FIG. 9, the resulting CIPT effect is drawn in (graph 430c), which would result by a 4 nm-thick copper layer on PtMn. Thus, the simulation shows that thereby almost a doubling to ~26% can be achieved. With a layer TMR effect of >200%, this would correspond to a measured resistance signal of >52%, which corresponds to about a five-fold increase in sensitivity of typical TMR structures in CIP configuration. Advantageous contact area spacings $X_0$ range from 1.5 to 20 µm. Such spacings can reproducibly be realized easily with the process technology common in the semiconductor industry.

Figure 10:
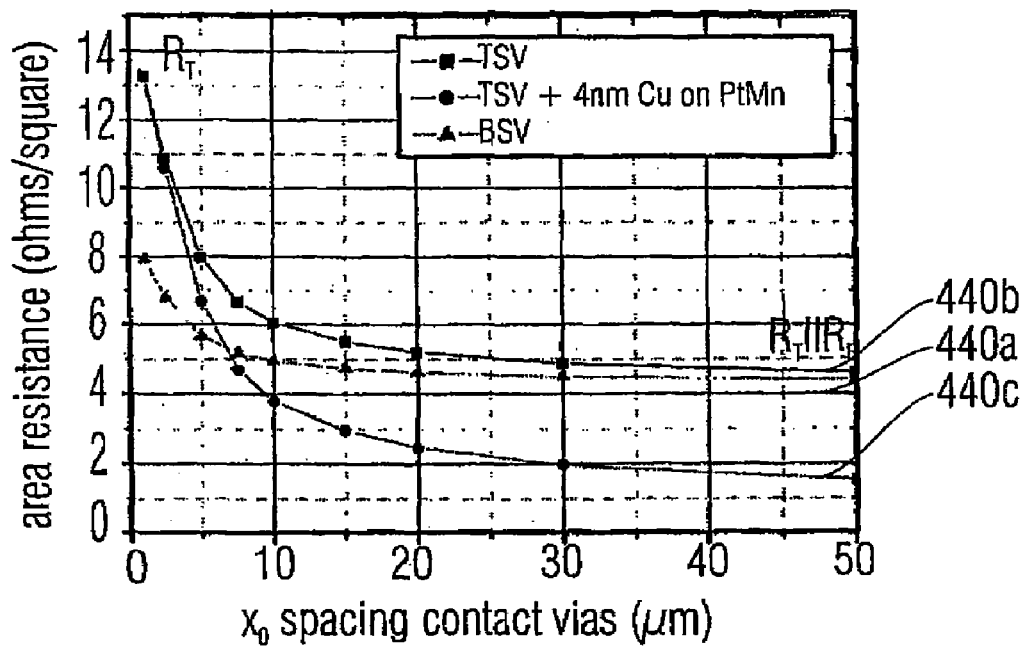
FIG. 10 shows graphs of an area resistance as a function of the contact area spacing for the contactings of different TMR layer stack types.

FIG. 10 shows a minimum area resistance as a function of the contact area spacing $X_0$ for the contacting of various TMR layer stacks (see FIG. 9), as calculated in 2D simulations. As in FIG. 9, here various contactings have been chosen, and, again, three graphs 440a, 440b and 440c are shown. The graph 440a again refers to a BSV contacting, the graph 440b to a TSV contacting, and the graph 440c finally refers to a TSV contacting, wherein a conductive layer 662 was again applied on the natural antiferromagnetic layer structure 660. In this example, again a copper layer of 4 nm thickness was chosen for the conductive layer 662.

As in FIG. 9, the different stack configurations also make themselves felt in the resulting area resistance, as it results from the 2D simulations. Here, it can be seen that the greatest area resistance is attained with the TSV variant without a copper layer (graph 440b) and with the copper layer (graph 440c) on the exemplary PtMn layer 660 at small contact spacings, wherein the parallel resistance, which results for great contact spacings $X_0$, of the layers on both sides of the tunnel barrier is smaller for the variants with the conductive additional layer 662. In comparison with the TSV system, due to the conductive, thick, exemplary PtMn layer 660 facing the contacts, the BSV configuration has a smaller area resistance, which again adapts itself toward great spacings $X_0$, because then the entire layer package determines the resistance.

Figure 11A:
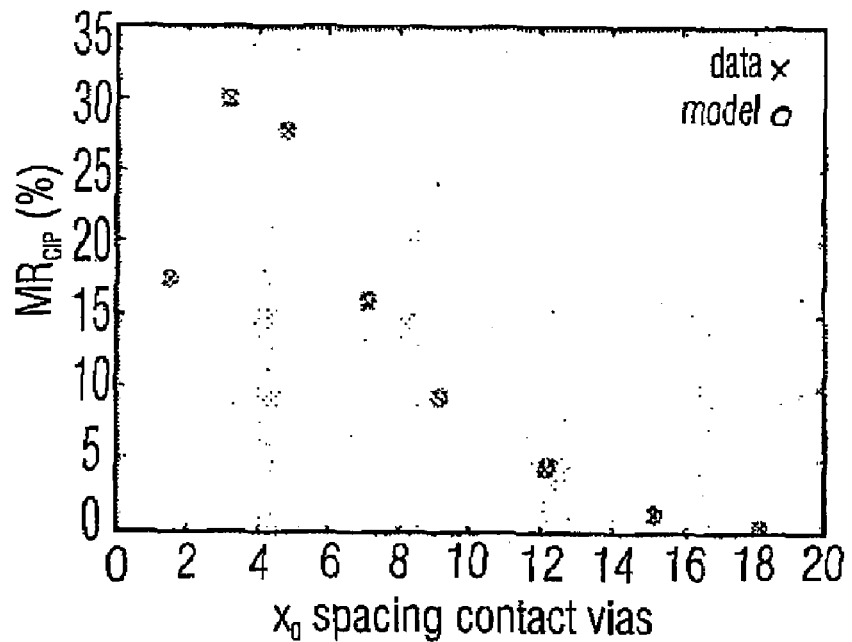
FIG. 11a shows a graph of a magnetoresistance as a function of the contact area spacing in a CIP contacting.
Figure 11B:
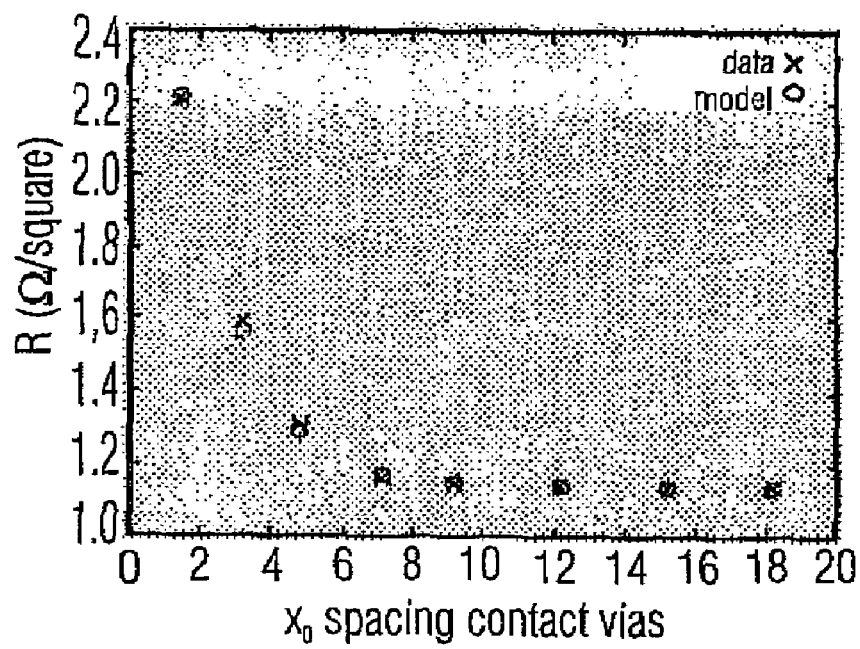
FIG. 11b shows a graph of a resistance as a function of the contact area spacing in the CIP contacting.

FIGS. 11a and 11b show typical measurements of the magnetoresistance ($MR_{CIP}$) and of the resistance per square (R) during CIP measurement depending on the contact spacings $X_0$. The examples are measurements for the layer characterization of unstructured TMR layer systems. As it is shown in FIG. 11a, the magnetoresistance has a maximum at about 3 to 4 µm and drops for both increasing and decreasing contact area spacing $X_0$. The maximum value for the magnetoresistance is about 30% here. As it is shown in FIG. 11b, the resistance R decreases monotonously with growing contact area spacing $X_0$ down to a minimum value at about 1.15 'Ω/□. Moreover, both graphs show good agreement between the measured values (drawn with "o") and the calculated values (drawn with "o"), which may, for example, be obtained using the above-mentioned models.

For these measurements, for example, the following configuration may be taken. As a typical MTJ stack (see FIG. 3), the following layer sequence S1/R/R1/B1/FL/C1/HM1 may be taken, with S1 representing the seed layer 310, R and R1 two reference layers (for example, the natural antiferromagnetic layer structure 660 and the artificial antiferromagnetic layer structure 680), B1 the barrier layer 110, FL the sensor layer 330, C1 the cover layer 340 and HM1 the mask layer 350. Possible layer thicknesses and materials (including alternatives) for the individual layers may be indicated as follows:

S1: CuN 50 nm (Cu, Ru, Ta, TaN, NiFe, NiFeCr);
R: nAFM PtMn 12 nm (NiFeCr/PtMn; IrMn);
R1:CoFe/Ru/CoFe 2/0.8/2 nm;
B1: MgO 0.6 nm;
FL: NiFe 5 nm (CoFeB, CoFe, CoFeNi);
C1:TaN 10 nm (Ta, Ru, Ti, TiN, Cu, CuN); and
HM1:Ru 7 nm (Ta, TaN, Ti, TiN, Cu, CuN).

For the exemplary measurements, for example, the following resistances resulted:

$R_T$~3 ohms/sq (or 3.08 ohms/sq);
$R_B$~1.8 ohms/sq;
RA~20 ohms·µm² (or 18.28 ohms·µm²);
R_parallel=1.2 ohms/sq ($R_p$);
R_antiparallel=2.2 ohms/sq ($R_{ap}$);
$MR_{CIP}$~30% at a contact spacing $X_0$~4 µm (MTJ MR~200% or 193.8%).

Figure 12:
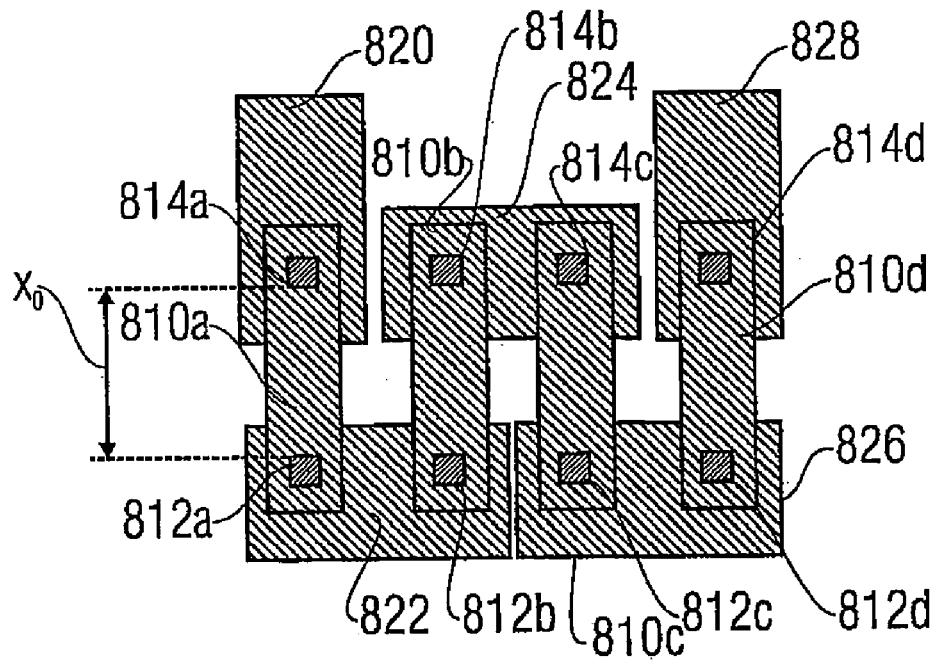
FIG. 12 is a schematic top view of a series connection of several TMR elements having identical contact area spacings in CIP contacting according to an embodiment.

As can be seen from FIG. 10, the area resistance in the region of the optimum contact spacing depending on the chosen contacting lies at ~15-20 ohms/square or at 15-30 ohms/square. From the circuit perspective, in most cases, a higher resistance is desirable, so that a series connection of several single TMR elements is advantageous. As depicted in FIG. 12, this may be done by a plurality of TMR elements in CIPT configuration with identical contact spacings.

In detail, FIG. 12 shows a schematic top view onto a series connection of several TMR elements (or magnetoresistive magnetic field sensor elements) in CIPT configuration for achieving higher resistances. FIG. 12 shows four TMR elements 810a, 810b, 810c and 810d, each having a first contact terminal 812a, 812b, 812c and 812d, and each having a second contact terminal 814a, 814b, 814c and 814d. The contact spacing $X_0$ of the respective first contact terminal 812 to the respective second contact terminal 814 is chosen identical in this embodiment. Moreover, the TMR elements are connected in series, i.e. the second contact terminal of the first TMR element is contacted with a first electrical connection element 820, a second electrical connection element 822 establishes an electrical connection between the first contact terminal of the first TMR element 812a and the first contact terminal 812b of the second TMR element. Similarly, a third electrical connection element 824 connects the two contact terminals of the second TMR element 810b and the third TMR element 810c, and a third electrical connection element 826 finally connects the respective first contact terminal of the third TMR element 810c and of the fourth TMR element 810d. A final contacting of the second contact terminal of the fourth TMR element 814d is done via a fourth electrical connection element 828.

Figure 13:
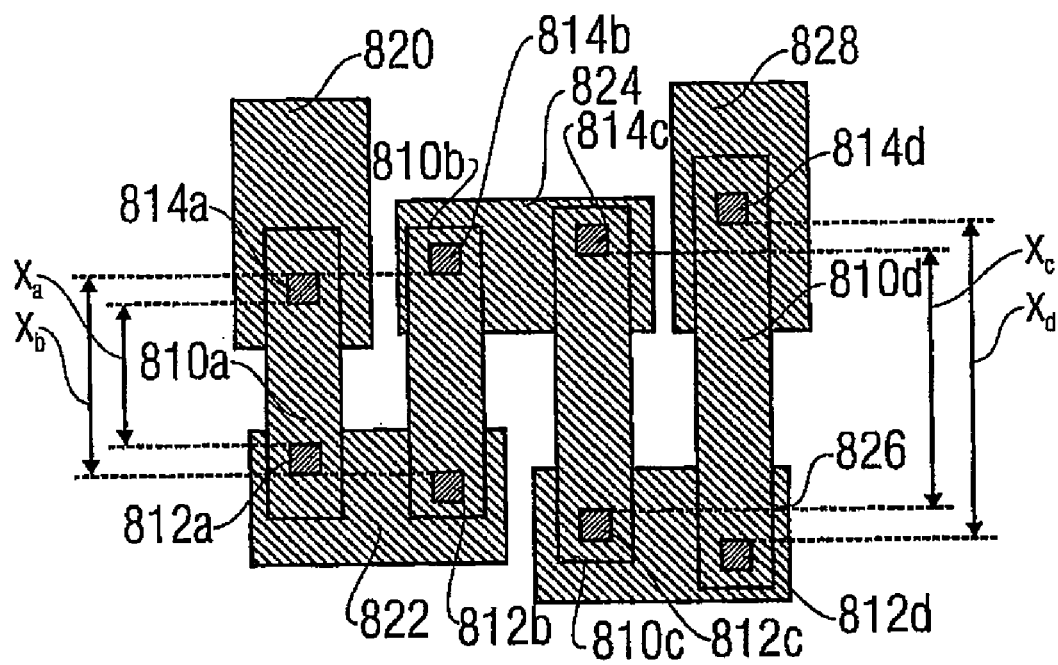
FIG. 13 is a schematic top view of a series connection of several TMR elements having different contact area spacings in CIP contacting according to an embodiment.

The signal optimum with reference to the contact spacing is relatively narrow (see FIG. 9). At a set contact spacing, in the case of fabrication-induced variations of the layer resistance, for example, it therefore has to be reckoned with a non-optimal CIPT signal or with variations of the signal-over the wafer or from wafer to wafer. Since an attached signal-processing circuit technology can only process a limited signal region, an arrangement as illustrated in a further embodiment in FIG. 13 is advantageous.

In detail, FIG. 13 again shows a schematic top view onto a series connection of several TMR elements in CIPT configurations for achieving higher resistances, but with the spacings $X_0$ of the respective first contact terminals 812 to the respective second contact terminals 814 being chosen differently for the individual TMR elements in this embodiment, as compared with the embodiment of FIG. 12. For example, the first TMR element 810a has a contact spacing $X_a$, the second TMR element 810b a contact spacing $X_b$, the third TMR element 810c a contact spacing $X_c$, and the fourth TMR element 810d finally a contact spacing $X_d$. As with the embodiment described in the context of FIG. 12, the TMR elements 810a, 810b, 810c and 810d are also connected in series here using the electrical connection elements 820, 822, 824, 826 and 828.

Thus, here also a plurality of single TMR elements are connected to each other in CIPT configuration, with the contact spacings $X_0$ varying around the optimum value. Although a swing that is reduced as opposed to the optimum TIPT signal is attained thereby, it remains stable at slight fluctuations of layer thickness or resistivity, for example, which favors mass production with high yield, i.e. with only few elements defective within given specifications.

The high yield also is particularly advantageous in that an associated signal-processing circuit technology may be designed more easily with respect to resolution and sensitivity, because with the sensor elements, which are designed corresponding to the embodiments, given specifications can be met in an extremely exact manner.

In a further embodiment, a plurality of single TMR elements with different contact spacings $X_0$ may be included in the layout, the contacting of which may be changed by a mask in a metal plane. This increases the adaptability to different application requirements and process changes. The contacts may exist in various sizes and shapes, e.g. round, elliptical, square, rectangular, stripe-shaped. Furthermore, in further embodiments, sensor elements with equal or different contact area spacings $X_0$, $X_a$, ... are connected in parallel instead of in series. As an alternative, this parallel connection may also be realized by the above-mentioned additional terminal regions 140' and 150'.

Figure 14:
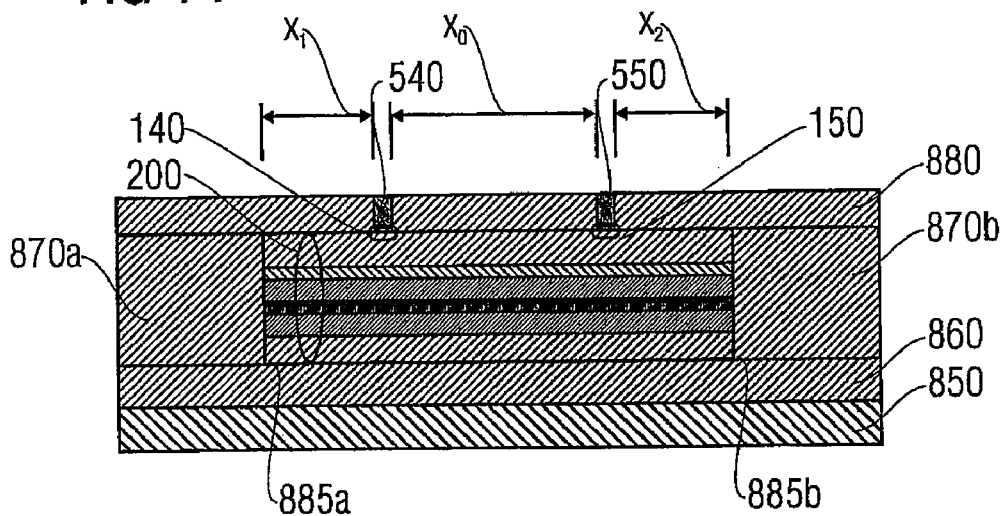
FIG. 14 shows an implementation of an MTJ stack having two contacts according to an embodiment.

The influence of shorts at edges of the sensor layer may be reduced if a contact spacing is provided between the contact via (contact areas 812, 814) and the edge of the sensor layer, as shown in FIG. 12. A simple implementation is shown in FIG. 14. The principle also applies to contacting from below and/or with several contacts in arbitrary arrangement.

In particular, FIG. 14 shows an embodiment with two contacts 140 and 150, which are at a contact spacing $X_0$. In this embodiment, on a metallization level 850, a first dielectric intermediate layer 860 is deposited, on which the MTJ stack 200 is deposited and is limited laterally by two parts of a second dielectric intermediate layer 870a and 870b. A third dielectric intermediate layer 880, which has a first via 540 and a second via 550, comes last, wherein the first contact terminal 140 contacts the first via 540 and the second contact terminal 150 contacts the second via 550 and is at a contact spacing $X_0$. In this cross-sectional view, the MTJ stack 200 has a left edge 885a and a right edge 885b, and the first via 540 has a lateral edge spacing $X_1$ to the left edge 885a, and the second via 550 has a lateral edge spacing $X_2$ to the right edge 885b.

In an etching process through the entire stack, an edge spacing $X_1$ or $X_2$ is left between the contact 540 or 550 to the edge of the stack 200. The results of an exemplary 1-dimensional simulation with a resistance model with a short at the edge and without a short are shown in FIG. 15.

Figure 15:
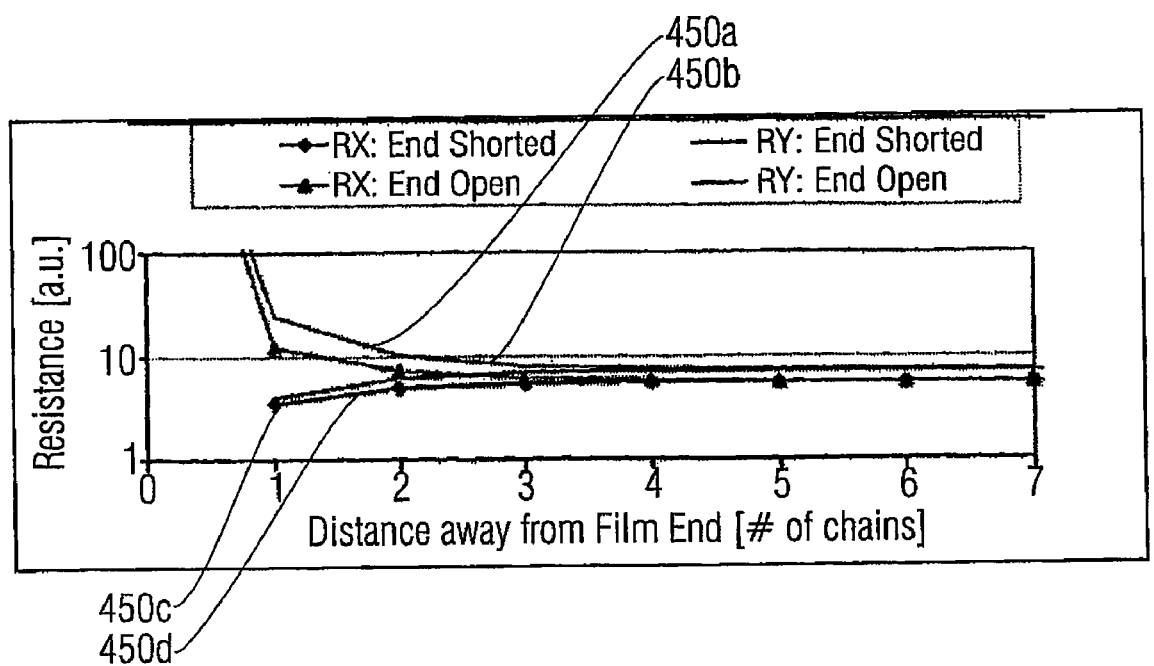
FIG. 15 shows graphs of resistances as a function of a spacing of the contacts from an edge region of the MTJ stack of FIG. 14 for a case with a short circuit at the edge and without a short circuit at the edge.

In detail, FIG. 15 shows a change in the resistance depending on the distance of the first contact terminal 140 of the second contact terminal 150 from the edge regions 885a or 885b. The graphs 450a and 450b describe the case when no short is present at the edges 858a or 858b, and the graphs 450c and 450d show the case when a short is present at the edges 858a or 858b. The graphs 450b and 450d here refer to the case of the external magnetic field being oriented in parallel to the pinned magnetization, whereas the graphs 450a and 450c refer to an antiparallel orientation of the external magnetic field with reference to the pinned magnetization. These graphs show that a potentially present short at the edges 885a or 885b loses significance with increasing distance of the first contact terminal 140 and the second contact terminal 150 from the edges 885a or 885b. For this reason, it is advantageous to perform contacting not directly at the edge of the MTJ stack.

Thus, it can be seen that the influence of the shorted stack edge 885a or 885b becomes negligible as compared with the non-shorted edge starting at an edge spacing $X_1$ (this also applies for $X'_1$ or $X''_1$, or $X_2$, $X'_2$ or $X''_2$) of preferably more than 0.5 λ and particularly of about 1-10 λ or 2-4 λ. For example, the following is assumed here: $R_2$~1.8 ohms, $R_1$~3.0 ohms, RA/$A_0$~12 or 25 ohms. Hereby, a failure of the sensor layer by a faulty or difficult-to-control etching process can be excluded. For this reason, a minimum spacing, which preferably ranges from 1-5 λ or even better from 2-4 λ (but at least >0.5 λ), is kept in the contacting. The minimum spacing is kept to each edge point, i.e. not only with reference to edge points lying along the current direction, but also for lateral (perpendicular to the current direction) edge points of the first magnetic layer structure 120. The edge spacings $X_1$ and $X_2$ may be chosen unequal, so that for the edge spacing $X_2$ (independently of $X_1$) preferably values of more than 0.5 λ and particularly of about 1-10 λ or 2-4 λ are applicable, in order to avoid the above-mentioned negative influences of shorted stack edges.

The same ranges also apply to the other edge spacings (i.e. for $X'_1, X''_1, X'_2, X''_2$), but wherein several or all edge spacings may also be chosen equal for symmetry reasons, particularly $X_1 = X_2$.

Figure 16:
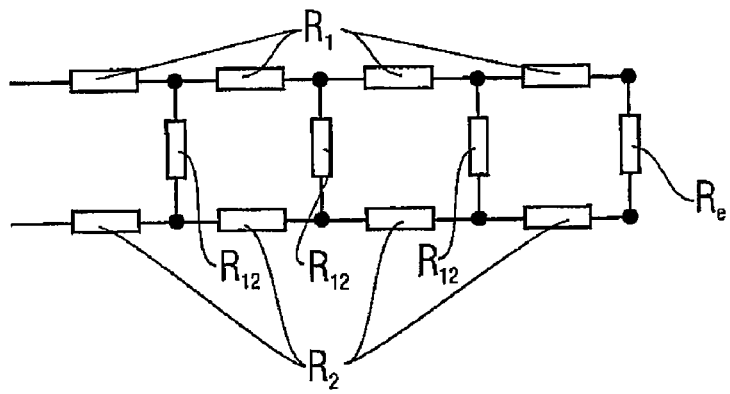
FIG. 16 is an illustration of a resistor network which may be used for the graphs of FIG. 15.

FIG. 16 shows a resistive network, which was used for the determination of the graph shown in FIG. 15. Here, the respective resistors $R_1$ and the resistors $R_2$ are connected via barrier resistors $R_{12}$, wherein the position of the barrier resistors $R_{12}$ was varied. A potentially present short at one of the edges 885a or 885b was simulated with an edge resistor $R_e$.

Figure 17:
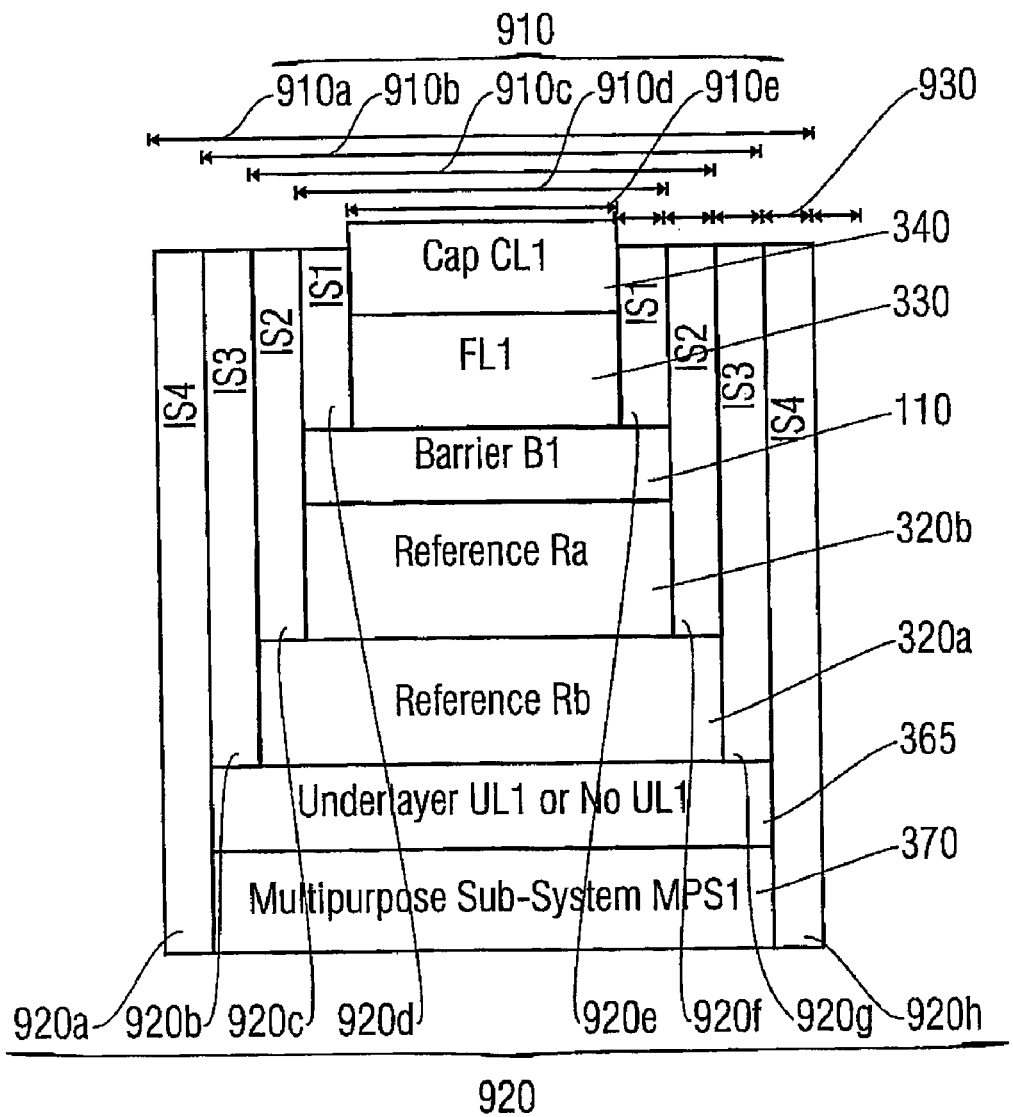
FIG. 17 shows an implementation of an MTJ stack having an enveloping spacer assembly according to an embodiment.

In a particular embodiment, the stack 200 may be surrounded with a dielectric spacer material in a step-shaped manner, wherein the horizontal layer thickness of the spacers may be variable (may range from 0-100 nm, for example), and FIG. 17 shows an embodiment with a spacer construction enclosing the stack 200.

In detail, FIG. 17 shows a cross-sectional view for an embodiment in which the layers of the MTJ stack 200 are dimensioned differently. An underlayer 365 is deposited on an underground 370, the underground 370 together with the under layer 365 having a layer width of 910b. A second reference layer 320b with a layer width of 910c is deposited thereon, followed by a first reference layer 320a in a layer width of 910d. Then, the barrier layer 110 follows, which at least partially also has the layer width of 910d and separates the reference layer from the first magnetic layer structure 120, which has a layer width 910e. Finally, a cover layer 340 is deposited, which also has a layer width of 910e. In the embodiments chosen here, the layer widths 910e, 910d, 910a and 910b are chosen in cascaded manner, so that the layer widths 910e, 910d, 910c and 910b become smaller with increasing height of the MTJ stack 200. The layer widths 910d-910e are adjusted by lateral spacers 920a, 920b, ..., 920h and at the same time serve for electrical insulation, so that a short at the edges is avoided if possible. In the embodiment shown here, all lateral spacers 920 have an equal layer thickness 930, which may, however, be varied in further embodiments. Finally, the underlayer 380 as well as the underground 370 are limited laterally by a spacer 920a and 920h, so that the entire MTJ stack 200 is insulated as far as possible.

In further embodiments, the individual layers of the MTJ stack 200 also have different layer widths 910, but lateral spacers 920 are at least partially omitted. Or, in a further embodiment, it is departed from the preferably step-shaped arrangement, so that the layer widths 910 do not increase or decrease from layer to layer, but one layer, such as the barrier layer 110, has a greatest lateral expansion. This would be advantageous regarding an insulation of the first and second magnetic layer structures 120, 130.

Figure 18A:
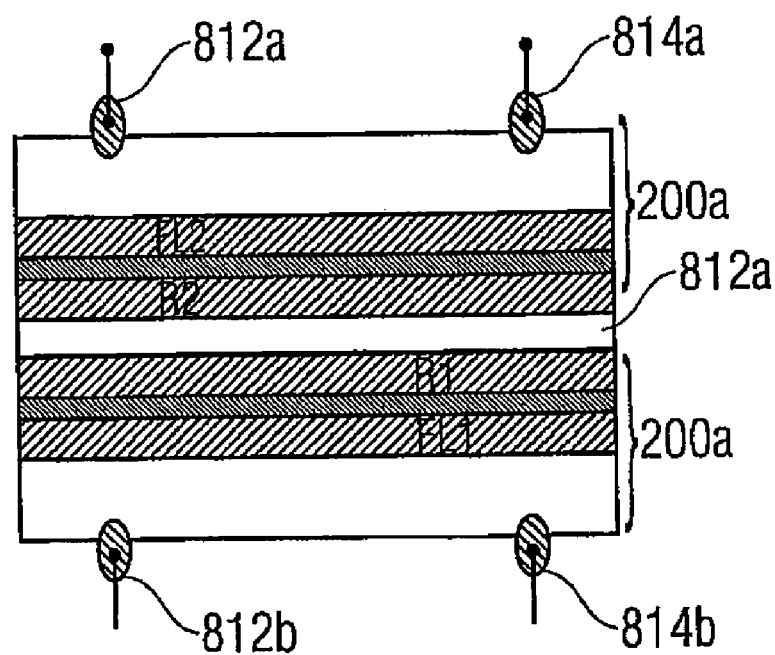
FIG. 18a shows an implementation of a double MTJ stack in a so-called double-decker concept according to an embodiment.
Figure 18B:
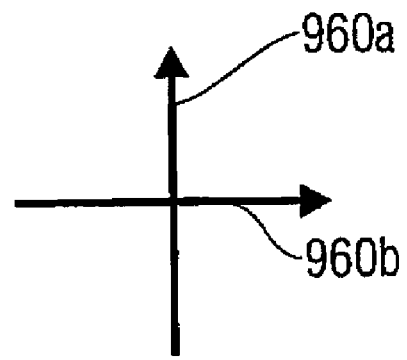
FIG. 18b shows potential magnetization directions for the double MTJ stack after pinning the magnetizations of both reference layers.

In a particular embodiment, the stack 200 (cf. FIG. 3) may be constructed in double manner. FIGS. 18a and 18b show an example for this so-called double-decker concept.

FIG. 18a shows an embodiment in which two MTJ stacks 200a, 200b are arranged on two opposite main surfaces of a separation layer 950 such that the respective first contact terminals 812a, 812b and the respective second contact terminals 814a, 814b are on opposite sides of the resulting layer sequence. In this embodiment, the pinned reference magnetization of the first MTJ stack 200a and the reference magnetization of the second MTJ stack 200b may be chosen to be different.

As shown in FIG. 18b, the magnetization 960a of the MTJ stack 200a and the magnetization 960b of the MTJ stack 200b may be chosen so that they form a right angle. This is advantageous in that the resulting sensor in this arrangement is not only sensitive in the angle range from 0 to 180°, but can sense changes of the magnetic field in the range from 0-360°. It is also possible that the magnetizations 960a and 960b form a different angle.

By suitable measures, the layer packages for the reference systems 960a (=top pinned) and 960b (=bottom pinned) thus may be designed so that the magnetizations (pinning direction) of the reference layers of 200a and 200b comprise an angle of 90° with respect to each other (FIG. 18b). This has the further advantage that sensor structures with different reference magnetizations, which have previously been arranged next to each other in space, can be united at one location, which means area savings. The evaluation takes place independently from each other by contacts from below and/or above (applying current to the respective structures in CIP configuration).

Finally, FIG. 19 shows an embodiment in which the four sensor elements 810a to 810d are connected to a so-called Wheatstone full bridge 900. Here, the first, second, third and fourth sensor elements 810a, 810b, 810c and 810d are connected into a closed ring. A connection between the first and the second sensor element 810a and 810b is contacted with a first terminal 980a; a connection between the second and the third sensor element 810b and 810c is contacted with a second terminal 880b; a connection between the third and the fourth sensor element 810c and 810d is contacted with a third terminal 980c; and a connection between the fourth and the first sensor element 810d and 810a is contacted with a fourth terminal 980a.

The sensor elements 810a to 810d, for example, comprise the following reference magnetizations. The reference magnetizations of the first and third sensor elements 810a and 810c are parallel to each other. Likewise, the reference magnetizations of the second and fourth sensor elements 810b and 810d are parallel to each other, i.e. such that they concurrently are antiparallel to the reference magnetizations of the first and third sensor elements 810a and 810c.

On applying a supply voltage, for example, between the contacts 980a and 980c, a voltage signal can be tapped between the contacts 980b and 980d, when an external magnetic field with a component in the layer plane is applied. This circuit is particularly advantageous in that a rotating external magnetic field 122 can be converted to an electric vibration signal, and hence a rotation speed of the rotating external magnetic field can be determined by a frequency measurement of the electric vibration signal.

In summary, among others, the embodiments exhibit the following advantages. Compared with TMR systems, they have a greater signal swing and, compared with conventional TMR systems, simpler contacting. Thus, they are more cost-effective and allow for use in integrated devices. Moreover, compared with conventional TMR systems, they are also advantageous in that shorts can be avoided effectively. With these advantages, embodiments may, for example, be employed in the automobile industry and in mechanical engineering, in order to perform accurate angle measurements or rotation speed measurements, for example, also particularly in a robust environment.

Also explicit rules and specifications regarding a method of producing a magnetoresistive sensor are disclosed. According to embodiments, a method of producing a magnetoresistive sensor element comprises the following steps and procedures. At first, a first magnetic layer structure is produced with a first and a second main surface and a resistance $R_1$ per unit area, wherein the first magnetic layer structure is contacted at the second main surface with a first and a second contact terminal at a contact spacing $X_0$ as well as a first and a second edge spacing $X_1, X_2$ from the edge of the first magnetic layer structure. Thereupon, a barrier layer with a resistance-area product RA is produced on the first main surface of the first magnetic layer structure, and a second magnetic layer structure with a first and a second main surface with a resistance $R_2$ per unit area is produced on the barrier layer. The values $R_1$, $R_2$ and RA yield a characteristic length $\lambda$ of the magnetoresistive sensor element by $$\lambda = \sqrt{\frac{RA}{R_1 + R_2}}.$$

The contact spacing $X_0$ has an m-fold value of the characteristic length $\lambda$ with $0.1<m<20$, the first edge spacing $X_1$ an n-fold value of the characteristic length $\lambda$ with $0.5<n$, the second edge spacing $X_2$ a p-fold value of the characteristic length $\lambda$ with $0.5<p$, the resistance $R_1$ a q-fold value of the resistance $R_2$ with $q>1$, and the first magnetic layer structure a first magnetization and the second magnetic layer structure a second magnetization, wherein a change $\Delta$ in the external magnetic field causes a relative change of the first and second magnetizations with respect to each other.

According to embodiments, a magnetoresistive sensor, for example, comprises one or more magnetoresistive sensor elements, wherein the magnetoresistive sensor elements are based on a TMR layer system and operated in CIP configuration, and the contacting takes place only from one side with at least 2 contact regions 140, 150. The contact spacing $X_0$ of the contacts 140, 150 of the magnetoresistive sensor elements ranges from 0.1-30 µm, for example.

Moreover, the single magnetoresistive elements may be deposited and connected on a common substrate 510. A corresponding sensor with single magnetoresistive elements is deposited and connected on a common substrate 510 as well as electrically connected to an integrated evaluation circuit deposited on the substrate 510.

According to further embodiments of the sensor, the contact spacing $X_0$ of the contact regions of the magnetoresistive sensor elements 810 is identical. In a further sensor, the contact spacing $X_0$ of the contact regions of the magnetoresistive sensor elements 810 is different.

In further embodiments, the sensor comprises several magnetoresistive sensor elements connected to a Wheatstone full bridge 900. Furthermore, the sensitivity of the magnetoresistive sensor elements can be improved or optimized by adding conductive layers 662. A still further embodiment of a sensor comprises a contacting from the substrate side (from below). In a further sensor, the contacting is done from the passivation side (from above).

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A magnetoresistive sensor element for sensing a magnetic field acting on the magnetoresistive sensor element, comprising:
    a first magnetic layer structure with a resistance $R_1$ per unit area and a first and a second main surface, wherein a first and a second contact terminal are arranged on the second main surface at a contact spacing $X_0$ with reference to each other;
    a second magnetic layer structure with a resistance $R_2$ per unit area and a first and a second main surface; and
    a barrier layer arranged between the first and the second magnetic layer structure adjacent to the first main surfaces thereof, so that the magnetoresistive sensor element comprises a resistance-area product RA,
    wherein, with $R_1$, $R_2$ and RA, a characteristic length $\lambda$ of the magnetoresistive sensor elements is given by $$\lambda = \sqrt{\frac{RA}{R_1 + R_2}}, \text{ and}$$

wherein the contact spacing X0 comprises an m-fold value of the characteristic length $\lambda$ with $0.1<m<20$, and
    wherein the first contact terminal comprises a first edge spacing $X_1$ from an edge of the first magnetic layer structure with an n-fold value of the characteristic length $\lambda$ with $0.5<n$, and
    wherein the second contact terminal comprises a second edge spacing $X_2$ from the edge of the first magnetic layer structure with a p-fold value of the characteristic length $\lambda$ with $0.5<p$, and
    wherein the resistance $R_1$ comprises a q-fold value of the resistance $R_2$ with $q<1$.

2. The magnetoresistive sensor element of claim 1, wherein the first magnetic layer structure comprises a first magnetization and the second magnetic layer structure a second magnetization, wherein a change $\Delta$ in the magnetic field causes a relative change of the first and second magnetizations with respect to each other, and wherein the first or the second magnetic layer structure comprises a pinned reference magnetization and the other of the first or the second magnetic layer structure a free magnetization orienting itself corresponding to a magnetic field.

3. The magnetoresistive sensor element of claim 1, wherein the contact spacing $X_0$ ranges from 0.1 µm to 100 µm, and wherein the resistances $R_1$ and $R_2$ range from 0.5 to 500 ohms per unit area.

4. The magnetoresistive sensor element of claim 1, wherein the following relations apply to the n-fold and the p-fold value of the characteristic length $\lambda$ for the first and second contact spacings $X_1$, $X_2$: $1<n<5$, $1<p<5$, wherein p equals n.

5. The magnetoresistive sensor element of claim 1, wherein the first magnetic layer structure comprises a first magnetization and the second magnetic layer structure a second magnetization, wherein a change $\Delta$ in the magnetic field causes a relative change of the first and second magnetizations with respect to each other, and wherein the second magnetic layer structure comprises the a reference magnetization and a layer sequence with at least one natural antiferromagnetic layer structure and one artificial antiferromagnetic layer structure, and wherein the first magnetic layer structure comprises a sensor layer.

6. The magnetoresistive sensor element of claim 5, further comprising a substrate and a passivation layer with a first and a second via, wherein the passivation layer is arranged on the second main surface of the first magnetic layer structure, and the first via is connected to the first contact terminal and the second via to the second contact terminal.

7. The magnetoresistive sensor element of claim 5, wherein the second magnetic layer structure further comprises at least one further conductive layer on the second main surface or within the second magnetic layer structure.

8. The magnetoresistive sensor element of claim 1, wherein the first magnetic layer structure comprises the reference magnetization and a layer sequence with at least one natural antiferromagnetic layer structure and one artificial antiferromagnetic layer structure, and wherein the second magnetic layer structure comprises a sensor layer.

9. The magnetoresistive sensor element of claim 8, further comprising a substrate and a passivation layer with a first and a second via, wherein the passivation layer is arranged on the second main surface of the first magnetic layer structure, and the first via is connected to the first contact terminal and the second via to the second contact terminal.

10. The magnetoresistive sensor element of claim 8, wherein the second magnetic layer structure further comprises at least a further conductive layer on the second main surface or within the second magnetic layer structure.

11. The magnetoresistive sensor element of claim 1, wherein the barrier layer and/or the first magnetic layer structure and/or the second magnetic layer structure comprise different lateral layer widths.

12. The magnetoresistive sensor element of claim 11, wherein the different layer widths change in step-shaped manner from layer to layer.

13. The magnetoresistive sensor element of claim 11, wherein the layer width of the barrier layer is greater than that of the first and second layer structures.

14. The magnetoresistive sensor element of claim 1, wherein the first and second contact terminals are provided for impressing an impression signal.

15. The magnetoresistive sensor element of claim 14, wherein the first and second contact terminals are provided for sensing a measurement signal.

16. The magnetoresistive sensor element of claim 14, further comprising a third and a fourth contact terminal, wherein the third and fourth contact terminals are provided for sensing a measurement signal.

17. A magnetoresistive sensor element for sensing a magnetic field acting on the magnetoresistive sensor element, comprising:
a first magnetic layer structure with a resistance $R_1$ per unit area and a first and a second main surface, wherein a first and a second contact terminal are arranged on the second main surface at a contact spacing $X_0$, and wherein the first magnetic layer structure comprises a pinned reference magnetization;
a second magnetic layer structure with a resistance $R_2$ per unit area and a first and a second main surface, wherein the second magnetic layer structure comprises a free magnetization orienting itself corresponding to a magnetic field; and
a barrier layer arranged between the first and the second magnetic layer structure adjacent to the first main surfaces thereof, so that the magnetoresistive sensor element comprises a resistance-area product RA,
wherein, with $R_1$, $R_2$ and RA, a characteristic length $\lambda$ of the magnetoresistive sensor elements is given by $$\lambda = \sqrt{\frac{RA}{R_1 + R_2}}, \text{ and}$$

wherein the contact spacing $X_0$ comprises an m-fold value of the characteristic length $\lambda$ with $0.1<m<20$, and wherein the first contact terminal comprises a first edge spacing $X_1$ from an edge of the first magnetic layer structure with an n-fold value of the characteristic length $\lambda$ with $0.5<n$, and
wherein the second contact terminal comprises a second edge spacing $X_2$ from the edge of the first magnetic layer structure with a p-fold value of the characteristic length $\lambda$ with $0.5<p$, and
wherein the resistance $R_1$ comprises a q-fold value of the resistance $R_2$ with $q>1$.

18. The magnetoresistive sensor element of claim 17, wherein the first magnetic layer structure comprises a layer sequence with at least one natural antiferromagnetic layer structure and one artificial antiferromagnetic layer structure.

19. The magnetoresistive sensor element of claim 17, wherein the second magnetic layer structure further comprises at least one further conductive layer on the second main surface or within the second magnetic layer structure.

20. The magnetoresistive sensor element of claim 17, further comprising a substrate with a first contacting and a second contacting, wherein the second main surface of the first magnetic layer structure is arranged on the substrate such that the first contacting is connected to the first contact terminal and the second contacting to the second contact terminal.

21. The magnetoresistive sensor element of claim 20, wherein the substrate comprises at least part of an evaluation circuit, and the evaluation circuit determines a change $\Delta$ in the magnetic field with reference to the $\Delta$ a pinned reference magnetization from a resistance change between the first and second terminal contacts.

22. A magnetoresistive sensor element for sensing a magnetic field acting on the magnetoresistive sensor element, comprising:
a first magnetic layer structure with a resistance $R_1$ per unit area and a first and a second main surface, wherein a first and a second contact terminal are arranged on the second main surface at a contact spacing $X_0$, and wherein the first magnetic layer structure comprises a free magnetization orienting itself corresponding to a magnetic field;
a second magnetic layer structure with a resistance $R_2$ per unit area and a first and a second main surface, wherein the second magnetic layer structure comprises a pinned reference magnetization; and
a barrier layer arranged between the first and the second magnetic layer structure adjacent to the first main surfaces thereof, so that the magnetoresistive sensor element comprises a resistance-area product RA,
wherein, with $R_1$, $R_2$ and RA, a characteristic length $\lambda$ of the magnetoresistive sensor elements is given by $$\lambda = \sqrt{\frac{RA}{R_1 + R_2}}, \text{ and}$$

wherein the contact spacing $X_0$ comprises an in-fold value of the characteristic length $\lambda$ with $0.1<m<20$, and
wherein the first contact terminal comprises a first edge spacing $X_1$ from an edge of the first magnetic layer structure with an n-fold value of the characteristic length $\lambda$ with $0.5<n$, and
wherein the second contact terminal comprises a second edge spacing $X_2$ from the edge of the first magnetic layer structure with a p-fold value of the characteristic length $\lambda$ with $0.5<p$, and
wherein the resistance $R_1$ comprises a q-fold value of the resistance $R_2$ with $q>1$.

23. The magnetoresistive sensor element of claim 22, wherein the second magnetic layer structure further comprises at least one further conductive layer on the second main surface or within the second magnetic layer structure.

24. The magnetoresistive sensor element of claim 22, wherein the second magnetic layer structure comprises a layer sequence with at least one natural antiferromagnetic layer structure and one artificial antiferromagnetic layer structure.

25. The magnetoresistive sensor element of claim 22, further comprising a substrate with a first contacting and a second contacting, wherein the second main surface of the first magnetic layer structure is arranged on the substrate such that the first contacting is connected to the first contact terminal and the second contacting to the second contact terminal.

26. The magnetoresistive sensor element of claim 25, wherein the substrate comprises at least part of an evaluation circuit, and the evaluation circuit determines a change Δ in the magnetic field with reference to a pinned reference magnetization from a resistance change between the first and second terminal contacts.

27. A sensor arrangement with a plurality of sensor elements, comprising:
a first magnetoresistive sensor element for sensing a magnetic field acting on the magnetoresistive sensor element, comprising:
a first magnetic layer structure with a resistance $R_1$ per unit area and a first and a second main surface, wherein a first and a second contact terminal are arranged on the second main surface at a first contact spacing $X_a$ with reference to each other;
a second magnetic layer structure with a resistance $R_2$ per unit area and a first and a second main surface; and
a barrier layer arranged between the first and the second magnetic layer structure adjacent to the first main surfaces thereof, so that the magnetoresistive sensor element comprises a resistance-area product RA,
wherein, with $R_1$, $R_2$ and RA, a characteristic length λ of the magnetoresistive sensor elements is given by $$\lambda = \sqrt{\frac{RA}{R_1 + R_2}}, \text{ and}$$

wherein the first contact spacing $X_a$ comprises an m-fold value of the characteristic length λ with 0.1<m<20, and
wherein the first contact terminal comprises a first edge spacing $X_1$ from an edge of the first magnetic layer structure with an n-fold value of the characteristic length λ with 0.5<n, and
wherein the second contact terminal comprises a second edge spacing $X_2$ from the edge of the first magnetic layer structure with a p-fold value of the characteristic length λ with 0.5<p, and
wherein the resistance $R_1$ comprises a q-fold value of the resistance $R_2$ with q>1,
a second magnetoresistive sensor element for sensing a magnetic field acting on the magnetoresistive sensor element, comprising:
a first magnetic layer structure with a resistance $R_1$ per unit area and a first and a second main surface, wherein a first and a second contact terminal are arranged on the second main surface at a second contact spacing $X_b$ with reference to each other;
a second magnetic layer structure with a resistance $R_2$ per unit area and a first and a second main surface; and
a barrier layer arranged between the first and the second magnetic layer structure adjacent to the first main surfaces thereof, so that the magnetoresistive sensor element comprises a resistance-area product RA,
wherein, with $R_1$, $R_2$ and RA, a characteristic length λ of the magnetoresistive sensor elements is given by $$\lambda = \sqrt{\frac{RA}{R_1 + R_2}}, \text{ and}$$

wherein the second contact spacing $X_b$ comprises an m-fold value of the characteristic length λ with 0.1<m<20, and
wherein the first contact terminal comprises a first edge spacing $X_1$ from an edge of the first magnetic layer structure with an n-fold value of the characteristic length λ with 0.5<n, and
wherein the second contact terminal comprises a second edge spacing $X_2$ from the edge of the first magnetic layer structure with a p-fold value of the characteristic length λ with 0.5<p, and
wherein the resistance $R_1$ comprises a q-fold value of the resistance $R_2$ with q>1,
wherein the first magnetoresistive sensor element and the second magnetoresistive sensor element are electrically connected to each other, or
wherein the first and second magnetoresistive sensor elements are separated with their second magnetic layer structures by a separation layer and are arranged mutually opposite with reference to the separation layer.

28. The sensor arrangement of claim 27, wherein the first magnetoresistive sensor element and the second magnetoresistive sensor element are electrically connected in series or in parallel.

29. The sensor arrangement of claim 27, wherein the first contact spacing $X_a$ is equal to the second contact spacing $X_b$, or wherein the first contact spacing $X_a$ is unequal to the second contact spacing $X_b$.

30. The sensor arrangement of claim 27, wherein the first and second magnetoresistive sensor elements are connected to form a Wheatstone half-bridge.

31. The sensor arrangement of claim 27, further comprising a third magnetoresistive sensor element for sensing a magnetic field acting on the magnetoresistive sensor element, comprising; a first magnetic layer structure with a resistance $R_1$ per unit area and a first and a second main surface, wherein a first and a second contact terminal are arranged on the second main surface at a first contact spacing $X_a$ with reference to each other; a second magnetic layer structure with a resistance $R_2$ per unit area and a first and a second main surface; and a barrier layer arranged between the first and the second magnetic layer structure adjacent to the first main surfaces thereof, so that the magnetoresistive sensor element comprises a resistance-area product RA, wherein, with $R_1$, $R_2$ and RA, a characteristic length λ of the magnetoresistive sensor elements is given by $$\lambda = \sqrt{\frac{RA}{R_1 + R_2}}, \text{ and}$$

wherein the first contact spacing $X_a$ comprises an m-fold value of the characteristic length λ with 0.1<m<20, and
wherein the first contact terminal comprises a first edge spacing $X_1$ from an edge of the first magnetic layer structure with an n-fold value of the characteristic length $\lambda$ with 0.5<n, and wherein the second contact terminal comprises a second edge spacing $X_2$ from the edge of the first magnetic layer structure with a p-fold value of the characteristic length $\lambda$ with 0.5<and wherein the resistance $R_1$ comprises a q-fold value of the resistance $R_2$ with q>1, and a fourth magnetoresistive sensor element for sensing a magnetic field acting on the magnetoresistive sensor element, comprising: a first magnetic layer structure with a resistance $R_1$ per unit area and a first and a second main surface, wherein a first and a second contact terminal are arranged on the second main surface at a second contact spacing $X_b$ with reference to each other; a second magnetic layer structure with a resistance $R_2$ per unit area and a first and a second main surface; and a barrier layer arranged between the first and the second magnetic layer structure adjacent to the first main surfaces thereof, so that the magnetoresistive sensor element comprises a resistance-area product RA, wherein, with $R_1$, $R_2$ and RA, a characteristic length $\lambda$ of the magnetoresistive sensor elements is given by $$\lambda = \sqrt{\frac{RA}{R_1 + R_2}}, \text{ and}$$

wherein the second contact spacing $X_b$ comprises an m-fold value of the characteristic length $\lambda$ with 0.1<m<20, and wherein the first contact terminal comprises a first edge spacing $X_1$ from an edge of the first magnetic layer structure with an n-fold value of the characteristic length $\lambda$ with 0.5<n, and wherein the second contact terminal comprises a second edge spacing $X_2$ from the edge of the first magnetic layer structure with a p-fold value of the characteristic length $\lambda$ with 0.5<p, and wherein the resistance $R_1$ comprises a q-fold value of the resistance $R_2$ with q>1, and wherein the first to fourth magnetoresistive sensor elements are connected to form a Wheatstone full bridge.

32. A method of producing a magnetoresistive sensor element, comprising:
producing a first magnetic layer structure with a first and a second main surface and a resistance $R_1$ per unit area;
contacting the first magnetic layer structure at the second main surface with a first and a second contact terminal at a contact spacing $X_0$ as well as a first and a second edge spacing $X_1$, $X_2$ from an edge of the first magnetic layer structure;
producing a barrier layer with a resistance-area product RA on the first main surface of the first magnetic layer structure;
producing a second magnetic layer structure with a first and a second main surface with a resistance $R_2$ per unit area on the barrier layer; and
wherein, with $R_1$ $R_2$ and RA, a characteristic length $\lambda$ of the magnetoresistive sensor elements is given by $$\lambda = \sqrt{\frac{RA}{R_1 + R_2}}, \text{ and}$$

wherein the contact spacing $X_0$ comprises an m-fold value of the characteristic length $\lambda$ with 0.1<m<20, and
wherein the edge spacing $X_1$ comprises an n-fold value of the characteristic length $\lambda$ with 0.5<n, and
wherein the second edge spacing $X_2$ comprises a p-fold value of the characteristic length $\lambda$ with 0.5<p, and
wherein the resistance $R_1$ comprises a q-fold value of the resistance $R_2$ with q>1, and
wherein the first magnetic layer structure comprises a first magnetization and the second magnetic layer structure a second magnetization, wherein a change $\Delta$ in the magnetic field causes a relative change of the first and second magnetizations with respect to each other.

33. The method of claim 32, wherein the step of contacting is performed such that the contact spacing $X_0$, ranges from 0.1 µm to 100 µm, and wherein the resistances $R_1$ and $R_2$ range from 0.5 to 500 ohms per unit area.

34. The method of claim 32, wherein the step of contacting is performed such that the following relations apply to the n-fold and the p-fold value of the characteristic length $\lambda$ for the first and second contact spacings $X_1$, $X_2$: 1<n<5, 1<p<5, wherein p equals n.

35. The method of claim 32, wherein the second magnetic layer structure comprises the reference magnetization, and wherein the step of depositing the second magnetic layer structure comprises depositing a layer sequence with at least one natural antiferromagnetic layer structure and one artificial antiferromagnetic layer structure, and wherein the step of depositing the first magnetic layer structure includes depositing a sensor layer.

36. The method of claim 32, wherein the first magnetic layer structure comprises the reference magnetization, and wherein the step of depositing the first magnetic layer structure comprises depositing a layer sequence with at least one natural antiferromagnetic layer structure and one artificial antiferromagnetic layer structure, and wherein the step of depositing the second magnetic layer structure includes depositing a sensor layer.

37. The method of claim 32, further comprising a step of depositing a passivation layer with a first and a second via on the second main surface of the first magnetic layer structure, wherein the first via is connected to the first contact terminal and the second via to the second contact terminal.

38. The method of claim 32, further comprising a step of depositing a conductive layer on the second main surface of the second magnetic layer structure or within the second magnetic layer structure.

39. The method of claim 32, wherein the step of depositing the barrier layer and/or the step of depositing the first magnetic layer structure and/or the step of depositing the second magnetic layer structure comprise depositing with different lateral layer widths.

40. The method of claim 39, wherein the different layer widths change in step-shaped manner from layer to layer.

41. The method of claim 39, wherein the step of depositing the barrier layer comprises a barrier layer with a layer width greater than that of the first and second layer structures.

* * * * *

UNITED STATES PATENT AND TRADEMARK OFFICE
CERTIFICATE OF CORRECTION

PATENT NO. : 7,495,434 B2 Page 1 of 1
APPLICATION NO. : 11/558525
DATED : February 24, 2009
INVENTOR(S) : Juergen Zimmer et al.

It is certified that error appears in the above-identified patent and that said Letters Patent is hereby corrected as shown below:

Column 22, claim 1, line 29; please replace "$q<1$" with --$q>1$--
Column 24, claim 21, line 28; please remove "the Δ"
Column 24, claim 22, line 56; please replace "in-fold" with --m-fold--

Signed and Sealed this

Twenty-third Day of June, 2009

JOHN DOLL
*Acting Director of the United States Patent and Trademark Office*